United States Patent
Joung et al.

(10) Patent No.: US 12,177,974 B2
(45) Date of Patent: Dec. 24, 2024

(54) CIRCUIT BOARD

(71) Applicant: LG INNOTEK CO., LTD., Seoul (KR)

(72) Inventors: Dong Hun Joung, Seoul (KR); Soon Gyu Kwon, Seoul (KR); Jung Ho Hwang, Seoul (KR); Min Ji Kim, Seoul (KR); Dae Gyu An, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 203 days.

(21) Appl. No.: 17/759,346

(22) PCT Filed: Jan. 15, 2021

(86) PCT No.: PCT/KR2021/000610
§ 371 (c)(1),
(2) Date: Jul. 22, 2022

(87) PCT Pub. No.: WO2021/149979
PCT Pub. Date: Jul. 29, 2021

(65) Prior Publication Data
US 2023/0049806 A1    Feb. 16, 2023

(30) Foreign Application Priority Data
Jan. 22, 2020    (KR) .................. 10-2020-0008650

(51) Int. Cl.
H05K 1/11    (2006.01)

(52) U.S. Cl.
CPC ... H05K 1/112 (2013.01); *H05K 2201/09518* (2013.01); *H05K 2201/096* (2013.01); *H05K 2201/09827* (2013.01)

(58) Field of Classification Search
None
See application file for complete search history.

(56) References Cited

U.S. PATENT DOCUMENTS

| | | |
|---|---|---|
| 7,152,318 B2 | 12/2006 | Kim et al. |
| 2012/0261166 A1 | 10/2012 | Oh et al. |
| | (Continued) | |

FOREIGN PATENT DOCUMENTS

| | | |
|---|---|---|
| CN | 102638948 A | 8/2012 |
| JP | 2009-252952 A | 10/2009 |
| | (Continued) | |

OTHER PUBLICATIONS

International Search Report dated May 4, 2021 in International Application No. PCT/KR2021/000610.
(Continued)

*Primary Examiner* — Hoa C Nguyen
*Assistant Examiner* — John B Freal
(74) *Attorney, Agent, or Firm* — Saliwanchik, Lloyd & Eisenschenk

(57) ABSTRACT

A circuit board according to an embodiment includes an insulating layer including a first via hole; a first via disposed in the first via hole of the insulating layer; wherein the first via includes: a first via part disposed in a first region of the first via hole; and a second via part disposed in a second region other than the first region of the first via hole; wherein the second region is a central region of the first via hole, and the first region is an outer region surrounding the second region; wherein the first via part and the second via part includes: a first surface in contact with each other; and a second surface other than the first surface exposed on the insulating layer; wherein the first surface has a first surface roughness; wherein the second surface has a second surface roughness different from the first surface roughness.

18 Claims, 18 Drawing Sheets

(56) References Cited

U.S. PATENT DOCUMENTS

2015/0053475 A1    2/2015  Kim
2016/0133555 A1*  5/2016  Nakamura ............. H05K 3/427
                                                        257/774
2020/0253062 A1*  8/2020  Zhang .................... H05K 1/186

FOREIGN PATENT DOCUMENTS

KR     10-2015-0021342 A    3/2015
KR     10-2015-0031031 A    3/2015
KR        10-1875943 B1    7/2018
KR     10-2019-0012075 A    2/2019

OTHER PUBLICATIONS

Supplementary European Search Report dated Mar. 25, 2024 in European Application No. 21744447.0.
Office Action dated May 13, 2024 in Korean Application No. 10-2020-0008650.

* cited by examiner

CIRCUIT BOARD

CROSS-REFERENCE TO RELATED APPLICATIONS

This application is the U.S. national stage application of International Patent Application No. PCT/KR2021/000610, filed Jan. 15, 2021, which claims the benefit under 35 U.S.C. § 119 of Korean Application No. 10-2020-0008650, filed Jan. 22, 2020, the disclosures of each of which are incorporated herein by reference in their entirety.

TECHNICAL FIELD

The embodiment relates to a circuit board.

BACKGROUND ART

As miniaturization, weight reduction, and integration of an electronic component are accelerated, a line width of a circuit has been miniaturized. In particular, a circuit line width of a package substrate or a printed circuit board on which the semiconductor chip is mounted has been miniaturized to several micrometers or less as a design rule of a semiconductor chip is integrated on a nanometer scale.

Various methods have been proposed in order to increase the degree of circuit integration of the printed circuit board, that is, to reduce the circuit line width. For the purpose of inhibiting loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for miniaturizing the circuit pitch.

Meanwhile, recently, efforts have been made to develop an improved 5G (5th generation) communication system or a pre-5G communication system in order to meet a demand for wireless data traffic. Here, the 5G communication system uses ultra-high frequency (mmWave) bands (sub 6 GHz, 28 GHz, 38 GHz, or higher frequencies) to achieve high data transfer rates.

In addition, in order to reduce a path loss of radio waves and increase a transmission distance of radio waves in the ultra-high frequency band, integration technologies such as beamforming, massive multi-input multi-output (massive MIMO), and array antennas have been developed in the 5G communication system. Considering that it may be composed of hundreds of active antennas of wavelengths in the frequency bands, an antenna system becomes large relatively.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

Meanwhile, recently, circuit boards including large-area vias have been developed in order to improve heat dissipation characteristics or shielding characteristics. The large-area via may be formed by filling a large-diameter via hole with a metal material. However, it is not easy to fill the large-diameter via hole with a metal material. Accordingly, a conventional large-area via includes a dimple region concavely recessed in the via hole direction on one surface. In addition, the dimple region may affect via hole processing during additional lamination, thereby affecting the reliability of the circuit board.

DISCLOSURE

Technical Problem

The embodiment provides a circuit board including a via having a new structure and a method of manufacturing the same.

In addition, the embodiment provides a circuit board including a via including a plurality of via parts disposed in a multi-layered structure in a via hole and a method of manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes an insulating layer including a first via hole; a first via disposed in the first via hole of the insulating layer; wherein the first via includes: a first via part disposed in a first region of the first via hole; and a second via part disposed in a second region other than the first region of the first via hole; wherein the second region is a central region of the first via hole, and the first region is an outer region surrounding the second region; wherein the first via part and the second via part includes: a first surface in contact with each other; and a second surface other than the first surface exposed on the insulating layer; wherein the first surface has a first surface roughness; and wherein the second surface has a second surface roughness different from the first surface roughness.

In addition, the first surface roughness is smaller than the second surface roughness.

In addition, each of the first via part and the second via part includes: a first portion disposed in the first via hole, and a second portion on the first portion protruding on an upper surface of the insulating layer; wherein the first surface includes an interface between the first portion of the first via part and the first portion of the second via part; and wherein the second surface includes an upper surface of the second portion of the first via part and an upper surface of the second portion of the second via part.

In addition, a height of the first surface decreases from an edge to a center.

In addition, a distance from the upper surface of the second portion of the first via part to a lowest point of the upper surface of the first portion of the first via part corresponds to 30% to 70% of a thickness of the first via.

In addition, a distance from the upper surface of the second portion of the second via part to a lowest point of a lower surface of the first portion of the second via part corresponds to 30% to 70% of a thickness of the first via.

In addition, an upper surface of the first via part is positioned on the same plane as an upper surface of the second via part.

In addition, the circuit board further includes a first pad disposed on a lower surface of the insulating layer and exposed through the first via hole; wherein the first portion of the first via part is disposed on the first pad exposed through the first via hole, and wherein the first portion of the second via part is disposed on the first portion of the first via part.

In addition, the insulating layer includes a first insulating layer and a second insulating layer on the first insulating layer, wherein the first via hole commonly passes through the first insulating layer and the second insulating layer.

In addition, the circuit board further includes: a second via disposed in a second via hole formed through the first insulating layer or the second insulating layer; wherein a size of the second via is smaller than a size of the first via, and wherein the second via of a single part is disposed in the second via hole.

In addition, the second via part includes: a first sub-second via part in contact with the first via part and filling a part of the second region of the first via hole; and a second sub-second via part in contact with the first sub-second via part and filling the remaining part of the second region of the first via hole.

On the other hand, the circuit board according to the embodiment includes a plurality of insulating layers; a first via disposed in a first via hole passing through the plurality of insulating layers in common; a second via disposed in a second via hole passing through any one of the plurality of insulating layers; a first pad disposed on a lower surface of a lowermost layer among the plurality of insulating layers and connected to the first via; and a second pad disposed on the lower surface of the lowermost layer and connected to the second via, wherein the first via includes a first via part and a second via part disposed in the first via hole and separated from each other through an interface, wherein the second via is disposed with a single part in the second via hole, and wherein a size of the first via is larger than a size of the second via.

In addition, the first via part and the second via part include a first surface in contact with another via part and a second surface other than the first surface and exposed on an upper surface of an uppermost layer of the plurality of insulating layers, wherein the first surface has a first surface roughness, and the second surface has a second surface roughness greater than the first surface roughness.

In addition, each of the first via part and the second via part includes: a first portion disposed in the first via hole, and a second portion on the first portion protruding on an upper surface of the insulating layer; wherein the first surface includes an interface between the first portion of the first via part and the first portion of the second via part; and wherein the second surface includes an upper surface of the second portion of the first via part and an upper surface of the second portion of the second via part, and wherein a height of the first surface decreases from an edge to a center.

In addition, a distance from the upper surface of the second portion of the first via part to a lowest point of the upper surface of the first portion of the first via part corresponds to 30% to 70% of a thickness of the first via, and a distance from the upper surface of the second portion of the second via part to a lowest point of a lower surface of the first portion of the second via part corresponds to 30% to 70% of a thickness of the first via.

On the other hand, a manufacturing method of the circuit board according to the embodiment includes preparing an insulating layer, forming a first pad on a lower surface of the insulating layer; forming a first via hole exposing an upper surface of the first pad in the insulating layer; disposing a first mask on an upper surface of the insulating layer, the first mask having a first opening exposing the first via hole and a part of the upper surface of the insulating layer extending from the first via hole; forming a first via part filling a part of the first via hole by performing a primary plating process on the upper surface of the first insulating layer and the first via hole exposed through the first opening of the first mask; primary grinding of an upper surface of the first via part; forming a second mask having a second opening having a width smaller than that of the first opening while exposing a part of the first opening on the first mask; forming a second via part filling the first via hole on the first via part exposed through the second opening of the second mask; removing the second mask; secondarily grinding an upper surface of the second via part and removing the third mask; and thirdly grinding the upper surface of the first via part and the upper surface of the second via part to form a first via filling the first via hole.

In addition, the first via part and the second via part include a first surface in contact with another via part and a second surface other than the first surface and exposed on an upper surface of an uppermost layer of the plurality of insulating layers, wherein the first surface has a first surface roughness, and the second surface has a second surface roughness greater than the first surface roughness.

In addition, each of the first via part and the second via part includes: a first portion disposed in the first via hole, and a second portion on the first portion protruding on an upper surface of the insulating layer; wherein the first surface includes an interface between the first portion of the first via part and the first portion of the second via part; and wherein the second surface includes an upper surface of the second portion of the first via part and an upper surface of the second portion of the second via part, and wherein a height of the first surface decreases from an edge to a center.

In addition, a distance from the upper surface of the second portion of the first via part to a lowest point of the upper surface of the first portion of the first via part corresponds to 30% to 70% of a thickness of the first via, and a distance from the upper surface of the second portion of the second via part to a lowest point of a lower surface of the first portion of the second via part corresponds to 30% to 70% of a thickness of the first via.

In addition, the forming of the second via part includes forming a first sub-second via part filling a part of the first via hole on the first via part; and forming a second sub-second via part filling the first via hole on the first sub-second via part.

In addition, the preparing of the insulating layer includes preparing a first insulating layer and a second insulating layer disposed on the second insulating layer, forming a second pad spaced apart from the first pad on the upper surface of the first insulating layer when the first pad is formed; forming a second via hole passing through the second insulating layer and exposing the second pad when the first via hole is formed; wherein the disposing of the first mask includes disposing the first mask having a third opening exposing the second via hole; and forming a second via filling the second via hole exposed through the third opening when the first via part is formed; grinding an upper surface of the second via together with the upper surface of the first via part during the primary grinding; wherein the second mask is formed to cover an upper surface of the second via, and wherein the thirdly grinding includes grinding the upper surface of the second via together with the upper surface of the first via part and the upper surface of the second via part.

Advantageous Effects

According to the embodiment, there is a restriction on the plating of a large-diameter via hole in the case of a conventional large-area via, but the embodiment can break the restriction on the large-diameter via-hole plating of a large-area via by changing the plating method, and accordingly, plating of the large-diameter via hole can be stably implemented. In addition, according to this embodiment, it is possible to secure the uniformity of the via plating compared to the conventional method, and quality reliability can be secured by improving laser quality after additional lamination.

In addition, in the prior art, there was a limit ratio in the method for stably realizing the plating inside the via hole between the thickness of the insulating layer and the size of the via hole. According to this embodiment, it is possible to break the design constraints for the implementation of a highly reliable plating state inside the via hole, and accordingly, the degree of design freedom may be improved. In addition, the embodiment can completely shield the interference between circuits occurring in a region where circuits are dense by increasing the size of the via, and it is possible to improve heat dissipation characteristics in a region where the role of heat dissipation is required.

Specifically, a heat dissipation function in the comparative example is performed using a plurality of heat dissipation vias spaced apart from each other by a predetermined interval in the horizontal direction. In the embodiment, a single large-area via is used to perform a heat dissipation function and to ensure the uniformity of its plating, and it is possible to improve the heat dissipation performance compared to the comparative example due to the increase in the area of the via.

BEST MODE

Figure 1:
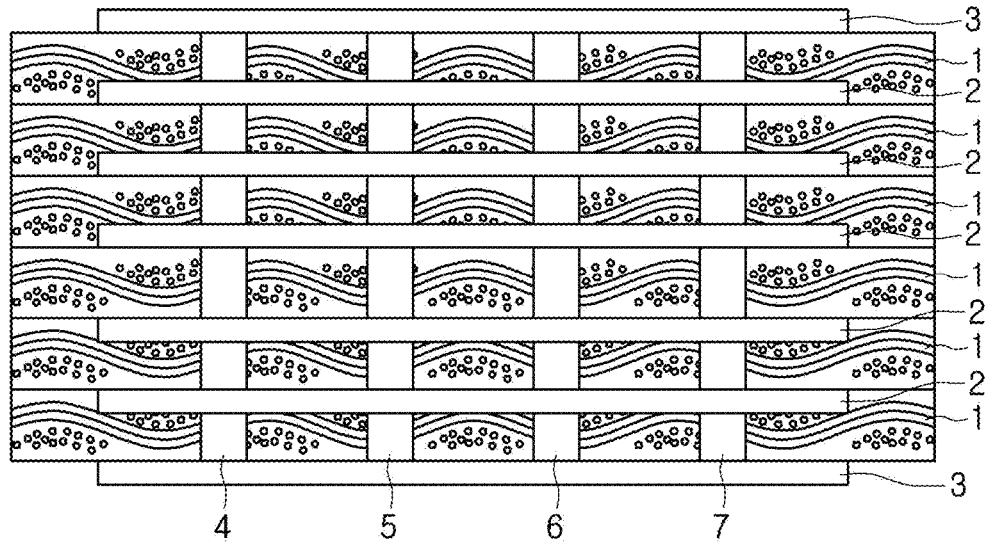
FIG. 1 shows a structure of a normal stack via in a first comparative example.

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "contacted" to another element, it can be directly connected or coupled to the other element or intervening elements may be present. In contrast, when an element is referred to as being "directly connected" or "directly contacted" to another element, there are no intervening elements present. Other words used to describe the relationship between elements should be interpreted in a like fashion (i.e., "between" versus "directly between," "adjacent" versus "directly adjacent," etc.).

As used herein, the singular forms "a," "an" and "the" are intended to include the plural forms as well, unless the context clearly indicates otherwise.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Hereinafter, an embodiment of the present invention will be described in detail with reference to the accompanying drawings.

Before the description of the present embodiment, a comparative example compared with the present embodiment will be described.

Figure 2:
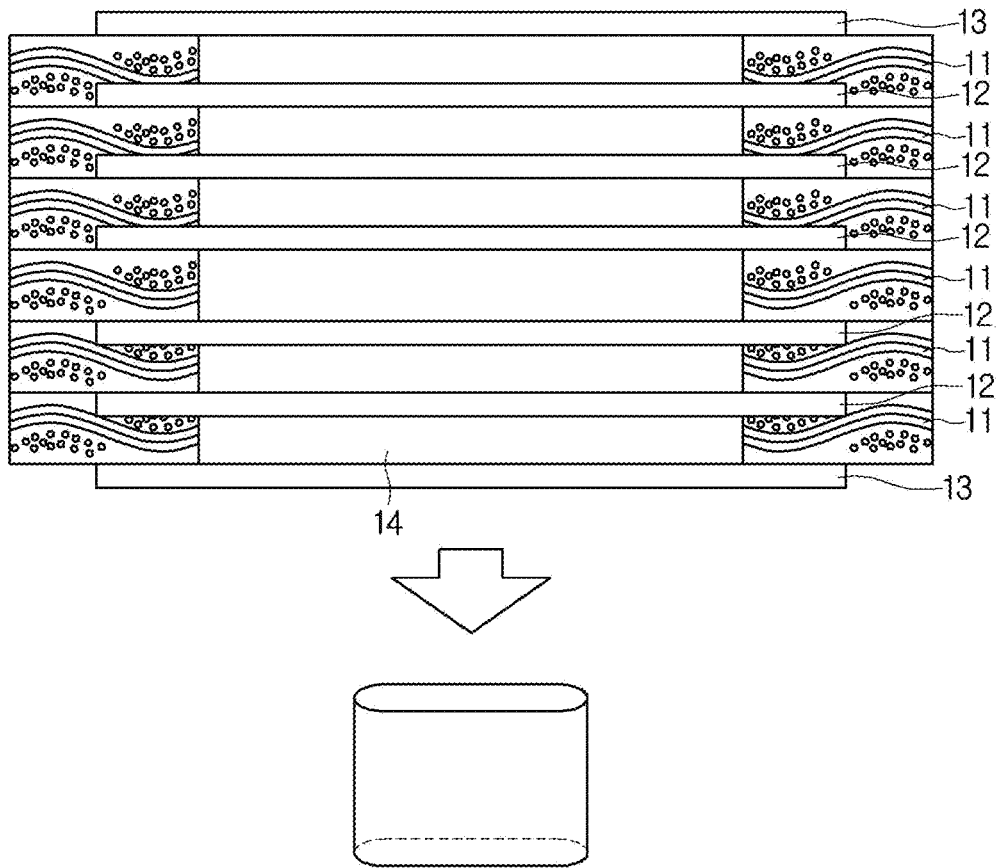
FIG. 2 shows a structure of a rod-type via in a second comparative example.
Figure 3:
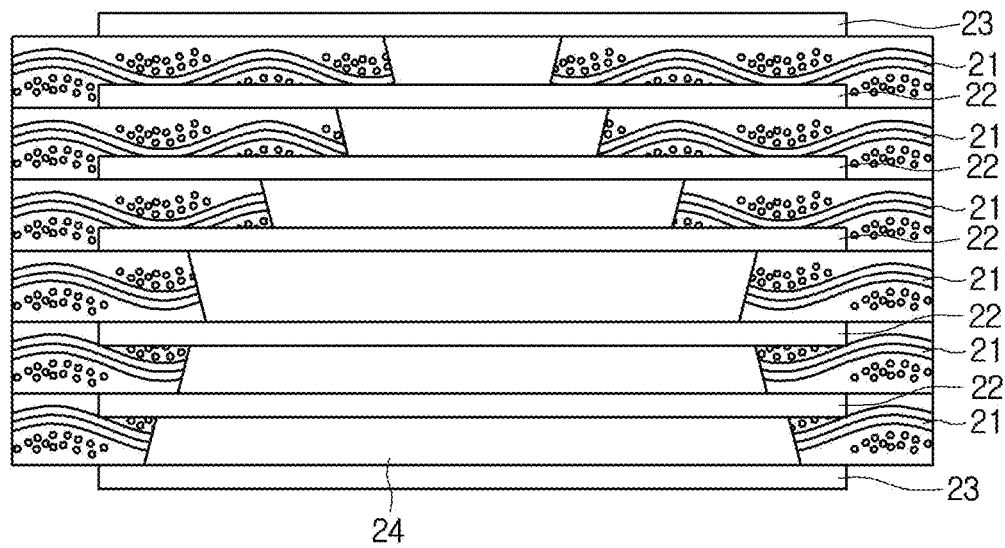
FIG. 3 shows a structure of a pyramid-type via in a third comparative example.

FIGS. 1 to 3 are cross-sectional views for explaining the via structure of a circuit board in a comparative example. FIG. 1 shows a structure of a normal stack via in a first comparative example, FIG. 2 shows a structure of a rod-type via in as a second comparative example, and FIG. 3 shows a structure of a pyramid-type via in a third comparative example.

Referring to FIG. 1, the circuit board includes a plurality of insulating layers 1 connected to each other, an inner pad 2 formed between different insulating layers, and an outer pad 3 formed on surfaces of the uppermost insulating layer and the lowermost insulating layer, and a plurality of vias respectively formed in the plurality of insulating layers 1.

The plurality of vias in the first comparative example include a first via 4, a second via 5, a third via 6, and a fourth via 7 which are spaced apart from each other at regular intervals. The first to fourth vias 4, 5, 6 and 7 are commonly connected to the inner layer pad 2 and the outer layer pad 3, respectively.

Referring to FIG. 2, the circuit board in the second comparative example includes a plurality of insulating layers 11 connected to each other, an inner pad 12 formed between different insulating layers, and an outer pad 13 formed on surfaces of the uppermost insulating layer and the lowermost insulating layer, and vias 14 respectively formed in the plurality of insulating layers 11.

The via 14 is formed to have a wider width than a normal via. For example, the via 14 may have a width corresponding to the sum of the widths of the first to fourth vias 4, 5, 6, and 7 illustrated in FIG. 1.

As shown in a lower portion of FIG. 2, the via 14 as described above has a shape corresponding to the via hole by plating the inside of the cylindrical via hole having a wide left and right width with a metal material.

Referring to FIG. 3, the circuit board in the third comparative example includes a plurality of insulating layers 21 connected to each other, an inner pad 22 formed between different insulating layers, an outer pad 23 formed on surfaces of the uppermost insulating layer and the lowermost insulating layer, and vias 24 respectively formed in the plurality of insulating layers 21.

In this case, the vias 24 formed in each insulating layer 21 have different widths. For example, a via formed in the central insulating layer has a first width, a via having a second width wider than the first width is formed from the central insulating layer toward the upper insulating layer, and as described above, a via having a third width wider than the first width is formed from the central insulating layer toward the lower insulating layer. In this case, the third width is wider than the second width.

However, as in the comparative example, the rod-type or pyramid-type via has a relatively large volume and a long shape compared to a general stack via, there is a very high possibility of dimples occurring during plating.

Figure 4:
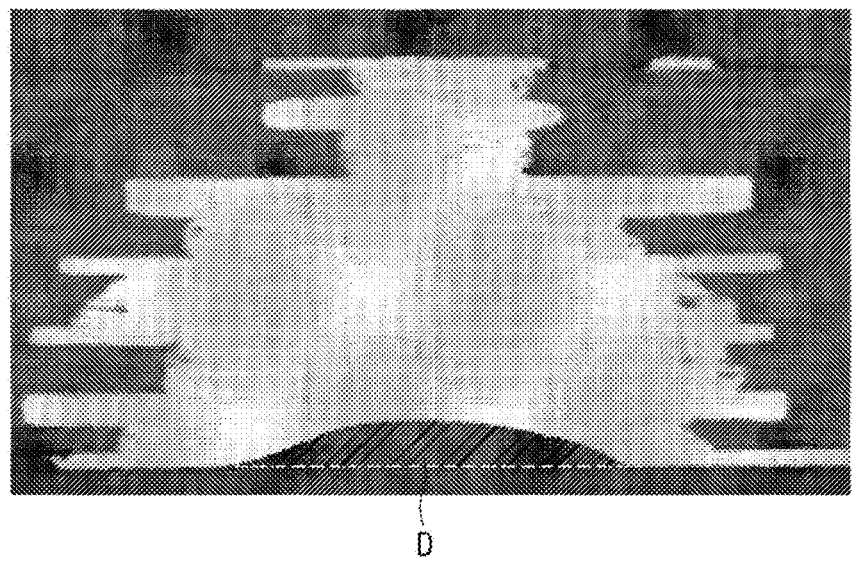
FIG. 4 shows a via formed by a comparative example.

FIG. 4 shows a via formed by a comparative example.

Referring to FIG. 4, the via may have a concave shape D in which the height of the central region is lower than that of the edge region, and this concave shape is referred to as a dimple phenomenon.

Accordingly, in the comparative example, the area of the via is limited in order to minimize the dimple phenomenon as described above. That is, in the comparative example, the size of the via is limited to an area at a level where the dimple phenomenon does not occur, and thus acts as a factor deteriorating the heat dissipation characteristics of the via.

In particular, when the size of the via hole is processed to have a diameter of 100 μm or more, the via fill plating is not performed smoothly, so that the concave dimple region D as described above is generated.

For example, in the comparative example, when the diameter of the via hole exceeds 100 μm, the via fill plating is not performed smoothly, so that the dimple region D concave in the downward direction is present on the upper surface of the via.

In addition, when the depth of the dimple region D is 10 μm or more, it is determined as defective and cannot be used, or when additional lamination proceeds after forming the core layer of the circuit board, there is a problem in that the processing of the via hole in the corresponding area does not proceed smoothly.

Meanwhile, in recent years, the size of the via hole has been greatly increased in order to improve the performance of vias serving as heat dissipation, shielding, and signal transmission, and accordingly, the size of the via hole or via is also increasing. In the embodiment, uniform plating can be performed over the entire region of the via hole even in a large-area via of 10 μm or more as described above, and accordingly, an object of the present invention is to provide a circuit board having a new structure capable of removing the dimple region of a via and a method for manufacturing the same.

Figure 5:
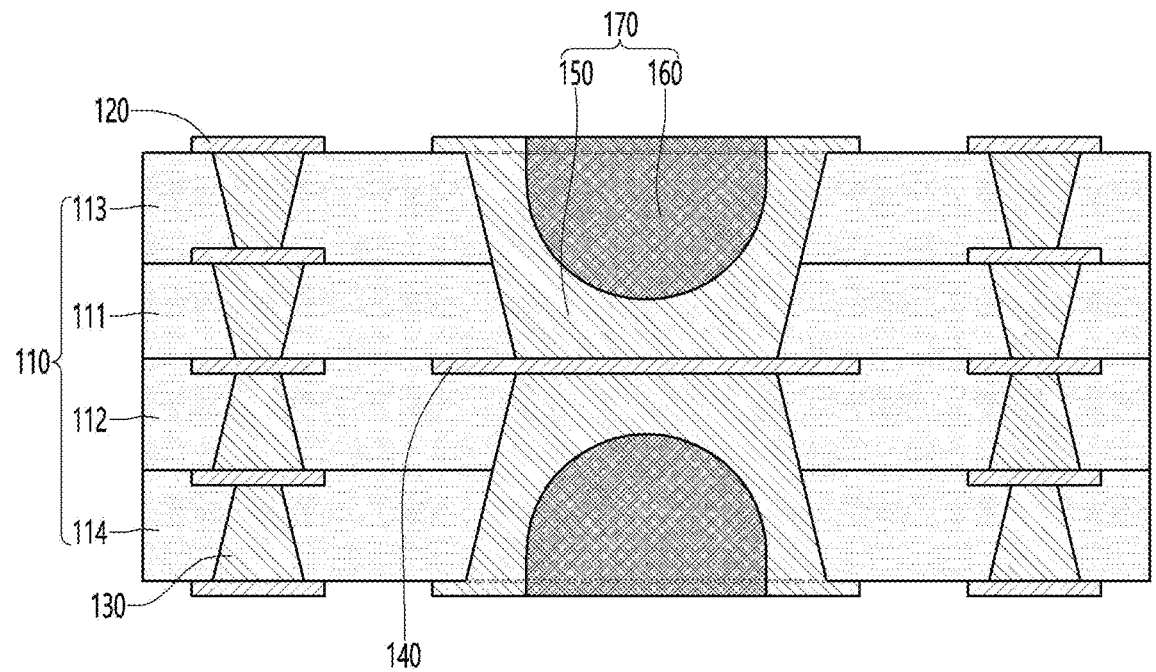
FIG. 5 is a view showing a circuit board according to a first embodiment.
Figure 6A:
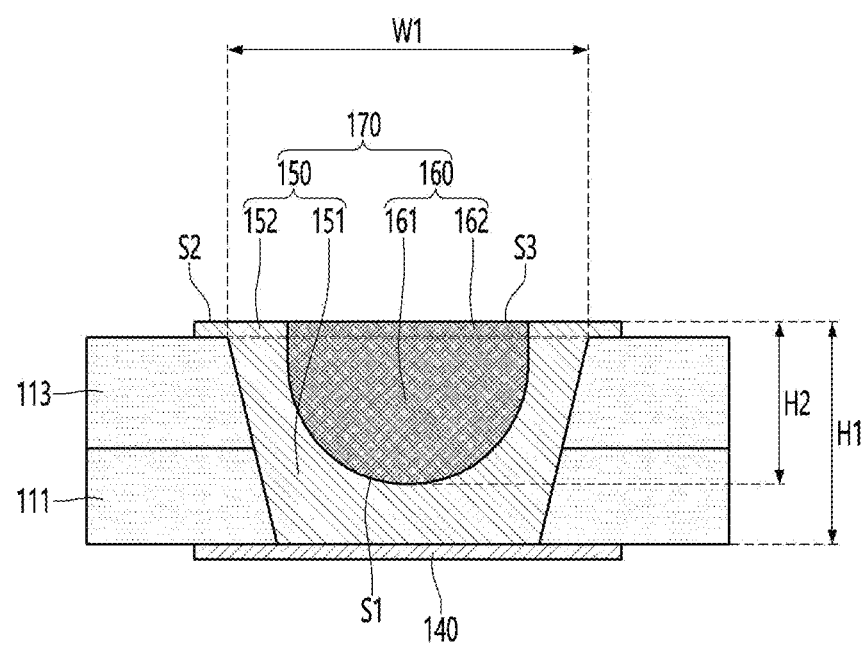
FIG. 6a is an enlarged view of a first via in FIG. 5.
Figure 6B:
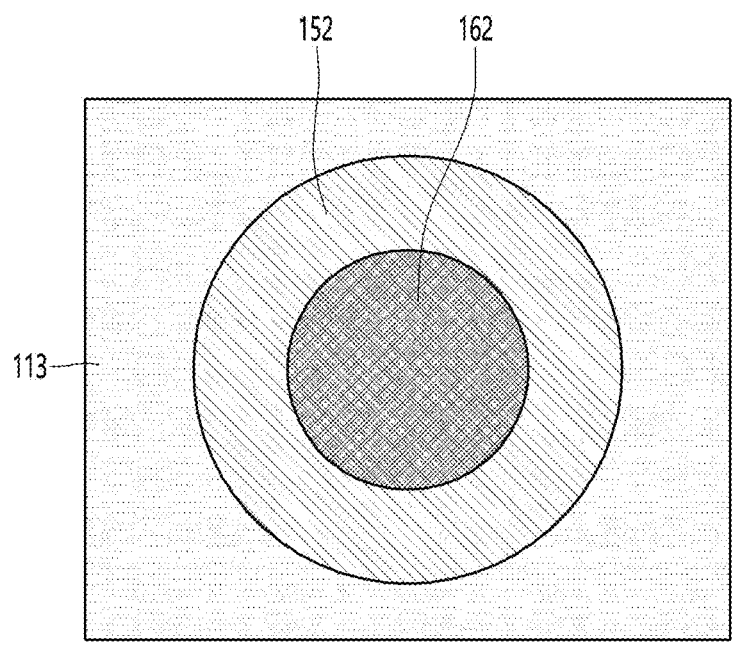
FIG. 6b is a plan view of a first via of FIG. 5.

FIG. 5 is a view showing a circuit board according to a first embodiment, FIG. 6a is an enlarged view of a first via in FIG. 5, and FIG. 6b is a plan view of a first via of FIG. 5.

Referring to FIGS. 5, 6a and 6b, the circuit board may include an insulating layer 110, a first pad 140 and a second pad 120 disposed on a surface of the insulating layer 110, and a first via 170 and a second via 130 disposed to pass through the insulating layer 110.

In the above, the first pad 140 may be in direct contact with the first via 170, and thus may be a part of a circuit pattern connected to the first via 170. In addition, the second pad 120 may be in contact with the second via 130, and thus may be a part of a circuit pattern connected to the second via 130. In this case, the first via 170 may have a first cross-sectional area, and the second via 130 may have a second cross-sectional area smaller than the first cross-sectional area. For example, the first via 170 may be a heat dissipation via having a heat dissipation function, and the second via 130 may be a signal via having a signal transmission function, but is not limited thereto. Preferably, the first via 170 and the second via 130 have different cross-sectional areas, and accordingly, the first via 170 and the second via 130 may have different shapes. Here, the different shapes do not mean the overall shape of the first via 170 and the overall shape of the second via 130, but may mean that the shape of each via part constituting of the first via 130 is different from the shape of the via part constituting of the second via 130.

This will be described in detail.

The circuit board includes an insulating layer 110. Preferably, the circuit board includes a plurality of insulating layers. For example, the circuit board may include a first insulating layer 111, a second insulating layer 112, a third insulating layer 113, and a fourth insulating layer 114, but is not limited thereto. For example, the circuit board may have a number of layers less than 4 layers, and alternatively may have a number of layers greater than 4 layers. However, the circuit board may include at least two insulating layers.

The insulating layer 110 may have a flat plate structure. The insulating layer 110 may be a printed circuit board (PCB). Here, the insulating layer 110 may be implemented as a multilayer substrate in which a plurality of insulating layers are successively stacked as described above.

In addition, a circuit pattern may be disposed on the surface of the insulating layer 110. For example, a circuit pattern may be disposed on each surface of the first insulating layer 111, the second insulating layer 112, the third insulating layer 113, and the fourth insulating layer 114. In this case, the circuit pattern may include a via pad connected to a via, a connection pad connected to an external substrate, a mounting pad on which an electronic component is mounted, and a trace serving as a signal transmission line between the pads. In addition, FIG. 5 in the embodiment may show a part of a via pad connected to a via among circuit patterns disposed on the surface of the insulating layer 110.

The insulating layer 110 is a substrate on which an electric circuit capable of changing wiring is formed, and may include all of a printed circuit board and an insulating substrate made of an insulating material capable of forming a circuit pattern on the surface of the insulating layer.

At least one of the first insulating layer 111, the second insulating layer 112, the third insulating layer 113, and the fourth insulating layer 114 may include a prepreg including glass fiber, have. In detail, at least one of the first insulating layer 111, the second insulating layer 112, the third insulating layer 113, and the fourth insulating layer 114 may include an epoxy resin and a material in which glass fibers and a silicon filler are dispersed in the epoxy resin.

In addition, at least one of the first insulating layer 111, the second insulating layer 112, the third insulating layer 113, and the fourth insulating layer 114 may be rigid or may be flexible. For example, at least one of the first insulating layer 111, the second insulating layer 112, the third insulating layer 113, and the fourth insulating layer 114 may include glass or plastic. In detail, at least one of the first insulating layer 111, the second insulating layer 112, the third insulating layer 113, and the fourth insulating layer 114 may include chemically strengthened/semi-tempered glass such as soda lime glass or aluminosilicate glass, or strengthened or flexible plastic such as polyimide (PI), polyethylene terephthalate (PET), propylene glycol (PPG) and polycarbonate (PC), or sapphire.

In addition, at least one of the first insulating layer 111, the second insulating layer 112, the third insulating layer 113, and the fourth insulating layer 114 may include an optical isotropic film. For example, at least one of the first insulating layer 111, the second insulating layer 112, the third insulating layer 113, and the fourth insulating layer 114 may be includes COC (cyclic Olefin Copolymer), COP (Cyclic Olefin Polymer), photo isotropic polycarbonate (polycarbonate, PC), or photo isotropic polymethyl methacrylate (PMMA).

In addition, at least one of the first insulating layer 111, the second insulating layer 112, the third insulating layer 113, and the fourth insulating layer 114 may be bent while having a partially curved surface. That is, at least one of the first insulating layer 111, the second insulating layer 112, the third insulating layer 113, and the fourth insulating layer 114 may be bent while having a partially flat surface and a partially curved surface. In detail, at least one of the first insulating layer 111, the second insulating layer 112, the third insulating layer 113, and the fourth insulating layer 114 may have a curved end while having a curved surface, or may have a surface including a random curvature and may be bent or curved.

In addition, at least one of the first insulating layer 111, the second insulating layer 112, the third insulating layer 113, and the fourth insulating layer 114 may be a flexible substrate having a flexible characteristic.

Also, at least one of the first insulating layer 111, the second insulating layer 112, the third insulating layer 113, and the fourth insulating layer 114 may be a curved or bended substrate.

The first insulating layer 111, the second insulating layer 112, the third insulating layer 113, and the fourth insulating layer 114 may each have a thickness of 20 µm to 500 µm. Preferably, at least one of the first insulating layer 111, the second insulating layer 112, the third insulating layer 113 and the fourth insulating layer 114 may have a thickness between 40 µm and 400 µm. More preferably, at least one of the first insulating layer 111, the second insulating layer 112, the third insulating layer 113 and the fourth insulating layer 114 may have a thickness between 60 µm and 250 µm. When the thickness of at least one of the first insulating layer 111, the second insulating layer 112, the third insulating layer 113, and the fourth insulating layer 114 is less than 20 µm, it may be difficult to form a circuit pattern on the surface of the insulating layer. When the thickness of at least one of the first insulating layer 111, the second insulating layer 112, the third insulating layer 113, and the fourth insulating layer 114 exceeds 500 µm, the overall thickness of the circuit board may increase.

A circuit pattern may be disposed on the surfaces of the first insulating layer 111, the second insulating layer 112, the third insulating layer 113, and the fourth insulating layer 114, for example, the first pad 140 and the second pad 120 may be disposed. The first pad 140 and the second pad 120 may be a part of a circuit pattern, and may refer to a part connected to a via among an entire region of the circuit pattern substantially disposed on the surface of each insulating layer.

The first pad 140 and the second pad 120 may be a pattern that transmits an electrical signal, or differently formed for the purpose of heat dissipation, may be a pattern that transmits heat.

For this, at least one of the first pad 140 and the second pad 120 may be formed of at least one metal material selected from gold (Au), silver (Ag), platinum (Pt), titanium (Ti), tin (Sn), copper (Cu), and zinc (Zn).

In addition, at least one of the first pad 140 and the second pad 120 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, at least one of the first pad 140 and the second pad 120 may be formed of copper (Cu) having high electrical conductivity and a relatively inexpensive price.

The first pad 140 and the second pad 120 may be formed by an additive process, a subtractive process, a modified semi additive process (MSAP), and a semi additive process (SAP) process, which are typical circuit board manufacturing processes. and a detailed description thereof will be omitted here.

The first pad 140 may be disposed on a surface of any one of the first insulating layer 111, the second insulating layer 112, the third insulating layer 113, and the fourth insulating layer 114. In other words, the first pad 140 may be connected to the first via 170 having a large area passing through the plurality of insulating layers in common. Accordingly, the first pad 140 may be disposed on the surface of a specific insulating layer disposed at the center of the plurality of insulating layers. For example, as shown in FIG. 5, the first pad 140 may be disposed on a lower surface of the first insulating layer 111, but is not limited thereto. However, the first pad 140 is disposed at the interface between the plurality of insulating layers, and accordingly, one end may be connected to the first via 170 disposed on the first pad 140, and the other end may be connected to the other first via 170 disposed under the first pad 140.

The first pad 140 may have a first cross-sectional area. Preferably, the first pad 140 may have a first cross-sectional area greater than an upper cross-sectional area or a lower cross-sectional area of the first via 170.

The second pad 120 may be disposed on the surfaces of the first insulating layer 111, the second insulating layer 112, the third insulating layer 113, and the fourth insulating layer 114, respectively. In other words, the second pad 120 may be connected to a normally-sized second via 130 passing through each insulating layer. Accordingly, the second pad 120 may be disposed on each surface of the plurality of insulating layers.

The second pad 120 may have a second cross-sectional area. Preferably, the second pad 120 may have a second cross-sectional area greater than an upper cross-sectional area or a lower cross-sectional area of the second via 130. In this case, the second cross-sectional area of the second pad 120 may be smaller than the first cross-sectional area of the first pad 140. That is, a size of the second pad 120 may be smaller than a size of the first pad 140.

The first pad 140 and the second pad 120 may have a thickness in the range of 5 μm to 50 μm. For example, the first pad 140 and the second pad 120 may have a thickness in a range of 10 μm to 40 μm. For example, the first pad 140 and the second pad 120 may have a thickness in the range of 15 μm to 35 μm. When the thickness of the first pad 140 and the second pad 120 is less than 5 μm, it may be difficult to form them. In addition, when the thickness of the first pad 140 and the second pad 120 exceeds 50 μm, the overall thickness of the circuit board may increase. Also, when the thickness of the first pad 140 and the second pad 120 is out of the range of 5 μm to 50 μm, a loss may occur during signal transmission.

The first via 170 and the second via 130 may be disposed to pass through the insulating layer 110. In this case, respective parts constituting the first via 170 and the second via 130 may have different shapes. This may occur because the size of the first via 170 and the size of the second via 130 are different from each other.

Preferably, the size of the first via 170 may be larger than the size of the second via 130. For example, a diameter of the first via 170 may be greater than 100 μm. In addition, the diameter of the second via 130 may be smaller than 100 μm. For example, the diameter of the first via 170 in the first direction may be greater than 500 μm. For example, the diameter of the first via 170 in a first direction may be greater than 1000 μm. For example, the diameter of the first via 170 in the first direction may be greater than 2000 μm. For example, the diameter of the first via 170 in the first direction may be greater than 2500 μm. For example, a diameter of the first via 170 in a second direction may be greater than 500 μm. For example, the diameter of the first via 170 in the second direction may be greater than 1000 μm. For example, the diameter of the first via 170 in the second direction may be greater than 2000 μm. For example, the diameter of the first via 170 in the first direction may be greater than 2500 μm.

In this case, the diameter of the first via 170 in the first direction may be the same as the diameter of the first via 170 in the second direction, but is not limited thereto. That is, the diameters of the first via 170 in the first direction and the diameter in the second direction may be different from each other.

The second via 130 may be a signal transmission via included in a general circuit board, and thus a detailed description thereof will be omitted.

However, the second via 130 in the embodiment can be formed together with the first via 170. In this case, the first via 170 includes a plurality of via parts formed through a plurality of processes, but the second via 130 includes a single part.

The first via 170 and the second via 130 may be formed by filling an inside of a via hole (not shown) penetrating at least one of the plurality of insulating layers with a conductive material.

The via hole may be formed by any one of mechanical, laser, and chemical processing. When the via hole is formed by machining, methods such as milling, drilling, and routing may be used, when formed by laser processing, a UV or CO2 laser method may be used, when formed by chemical, a chemical containing aminosilane, ketones, or the like. Accordingly, at least one of plurality of insulating layers 111, 112, 113, 114 and 115 may be opened.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the via hole is formed, the first via 170 and the second via 130 may be formed by filling the inside of the via hole with a conductive material. The metal material forming the first via 170 and the second via 130 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, inkjetting and dispensing.

Hereinafter, a structure of the first via 170 will be described in detail.

The first via 170 may include a first via part 150 disposed to fill a part of the first via hole that commonly passes through the plurality of insulating layers, and a second via part 160 disposed to fill the remaining part of the first via hole.

The first via part 150 may be formed in a first region of the first via hole. In addition, the second via part 160 may be formed in a second region of the first via hole except for the first region. The second region may be a central region of an upper region excluding a lower region of the first via hole. In addition, the first region may be a region other than the second region. Preferably, the first region may be a lower region and an outer region of an upper region of the first via hole.

That is, in the first embodiment, a part of the first via hole formed while passing through the plurality of insulating layers in common may be filled with the first via part 150, and the remaining part thereof may be filled with the second via part 160.

Each of the first via part 150 and the second via part 160 may include a portion disposed in the first via hole and a portion disposed on the portion disposed in the first via hole and protruding from the surface of the insulating layer 110.

That is, the first via part 150 includes a first portion 151 disposed in the first region of the first via hole. The first portion 151 may be referred to as a connection portion positioned in the first via hole. For example, the first portion 151 of the first via part 150 may form a part of the connection portion of the first via 170.

The first via part 150 may include a second portion 152 disposed on the first portion 151 and protruding from the upper surface of the insulating layer 110. The second portion 152 may be positioned on the opposite side of the first pad 140 with respect to the connection portion of the first via 170, and may be referred to as a via pad connected to the connection portion. For example, the second portion 152 of the first via part 150 may form a part of the pad of the first via 170.

The first portion 151 of the first via part 150 may be formed by filling only the first region corresponding to a partial region, not the entire region of the first via hole.

Accordingly, an upper surface of the first portion 151 of the first via part 150 may have a curved surface instead of a flat surface. Preferably, the upper surface of the first portion 151 of the first via part 150 may have a downwardly concave shape. Accordingly, a length of the upper surface of the first portion 151 of the first via part 150 may be greater than an upper width of the first via hole. That is, the length of the upper surface of the first portion 151 of the first via part 150 may be greater than the upper width corresponding to the linear distance of the upper region of the first via hole.

A part of the upper surface of the first portion 151 of the first via part 150 may be positioned lower than the upper surface of the insulating layer 110. Here, the insulating layer 110 may mean an insulating layer positioned at an uppermost side of the plurality of insulating layers in which the first via hole is formed. For example, a center point of the upper surface of the first portion 151 of the first via part 150 may be lower than the upper surface of the insulating layer 110. In this case, the upper surface of the first portion 151 of the first via part 150 may gradually decrease from an outer portion to a center portion. Accordingly, the center point of the upper surface of the first portion 151 of the first via part 150 may be the lowest, and an outer edge point of the upper surface of the first portion 151 of the first via part 150 may be positioned the highest. Accordingly, a concave portion may be formed in an upper surface of the first portion 151 of the first via part 150. Meanwhile, a length of a lower surface of the first portion 151 of the first via 170 may be the same as a lower width of the first via hole.

The second portion 152 of the first via part 150 may be positioned on the first portion 151. That is, the second portion 152 of the first via part 150 is integrally formed with the first portion 151. That is, the second portion 152 of the first via part 150 may extend from the first portion 151 and protrude above the upper surface of the insulating layer 110.

Meanwhile, the first via 170 may have a first thickness H1 The first thickness H1 of the first via 170 may mean a vertical straight distance from the lower surface of the first portion 151 of the first via part 150 to the upper surface of the second portion 152.

In this case, the thickness of the concave portion of the first via part 150 may have a second thickness H2. Here, the second thickness H2 of the concave portion of the first via part 150 may mean a vertical straight line distance from the upper surface of the second portion 152 of the first via part 150 to a lowest point of the upper surface of the first portion 151.

The second thickness H2 may be 30% to 70% of the first thickness H1. For example, the second thickness H2 may be 40% to 65% of the first thickness H1. For example, the second thickness H2 may be 50% to 60% of the first thickness H1. When the second thickness H2 is less than 30% of the first thickness H1, a thickness of a region to be removed by a polishing process increases in the process of forming the first via part 150 and the second via part 160, and accordingly, the manufacturing process may be complicated. Also, when the second thickness H2 is greater than 70% of the first thickness H1, even after the second via part 160 is formed, a dimple region may be formed on the second via part 160.

Meanwhile, the first via hole may have a first width W1. Preferably, the first width W1 of the first via hole may include a width in a first direction and a width in a second direction of the first via hole. In addition, a width of the first via hole in the first direction may be greater than 500 μm. For example, the width of the first via hole in the first direction may be greater than 1000 μm. For example, the width of the first via hole in the first direction may be greater than 2000 μm. For example, the width of the first via hole in the first direction may be greater than 2500 μm. For example, the width of the first via hole in the second direction may be greater than 500 μm. For example, the width of the first via hole in the second direction may be greater than 1000 μm. For example, the width of the first via hole in the second direction may be greater than 2000 μm. For example, the width of the first via hole in the first direction may be greater than 2500 μm.

In this case, the width of the first via hole in the first direction may be the same as the width of the first via hole in the second direction, but is not limited thereto. That is, the diameter of the first via hole in the first direction and the diameter in the second direction may be different from each other, and thus may have a bar or oval shape.

Meanwhile, when the width of the first via hole is smaller than the above range, it may have a size substantially corresponding to the second via 130, and thus only one single via part may be formed therein. That is, when the width of the via hole is smaller than the range of the width of the first via hole described above, the dimple region does not occur even if the interior of the via hole is filled in one process.

Meanwhile, the second via part 160 includes a first portion 161 disposed in the second region of the first via hole. The first portion 161 may also be referred to as a connection portion positioned in the first via hole. For example, the first portion 161 of the second via part 160 may form a part of the connection portion of the first via 170.

That is, the first portion 161 of the second via part 160 may form a connection portion of the first via 170 together with the first portion 151 of the first via part 150.

The second via part 160 may include a second portion 162 disposed on the first portion 161 and protruding from the upper surface of the insulating layer 110. The second portion 162 may be positioned on the opposite side of the first pad 140 with respect to the connection portion of the first via 170, and may be referred to as a via pad connected to the connection portion. For example, the second portion 162 of the second via part 160 may form a part of the pad of the first via 170. That is, the second portion 162 of the second via part 160 may form a pad (specifically, an upper pad) together with the second portion 152 of the first via part 150.

The first portion 161 of the second via part 160 may be formed by filling only a second region corresponding to a partial region, not the entire region of the first via hole. Specifically, the first portion 161 of the second via part 160 may be formed to fill a recess formed in the upper surface of the first region 151 of the first via part 150.

Accordingly, a lower surface of the first portion 161 of the second via part 160 may have a curved surface instead of a flat surface. Preferably, a lower surface of the first portion 161 of the second via part 160 may have a downwardly convex shape. Accordingly, a length of the lower surface of the first portion 161 of the second via part 160 may be greater than the upper width and the lower width of the first via hole, respectively. That is, the length of the lower surface of the first portion 161 of the second via part 160 may be greater than the upper width corresponding to the linear distance of the upper region of the first via hole.

A part of the lower surface of the first portion 161 of the second via part 160 may be positioned lower than the upper surface of the insulating layer 110. Here, the insulating layer 110 may mean an insulating layer positioned at an uppermost side among the plurality of insulating layers in which the first via hole is formed. For example, a center point of the lower surface of the first portion 161 of the second via part 160 may be lower than the upper surface of the insulating layer 110. In this case, the lower surface of the first portion 161 of the second via part 160 may gradually decrease from an outer portion to a center portion. Accordingly, the center point of the lower surface of the first portion 161 of the second via part 160 may be positioned at the lowest position, and the outer edge point may be positioned at the highest position. Accordingly, a convex portion may be formed on a lower surface of the first portion 161 of the second via part 160.

The second portion 162 of the second via part 160 may be positioned on the first portion 161. That is, the second portion 162 of the second via part 160 is integrally formed with the first portion 161. That is, the second portion 162 of the second via part 160 may extend from the first portion 161 to protrude above the upper surface of the insulating layer 110.

Meanwhile, the first via 170 may have a first thickness H1. The first thickness H1 of the first via 170 may mean a vertical straight distance from the lower surface of the first portion 151 of the first via part 150 to the upper surface of the second portion 152.

In this case, the thickness of the convex portion of the second via part 160 may have a second thickness H2. Here, the second thickness H2 of the convex portion of the second via part 160 may mean a vertical straight line distance from the upper surface of the second portion 162 of the second via part 160 to a lowest point of a lower surface of the first portion 161.

The second thickness H2 may be 30% to 70% of the first thickness H1. For example, the second thickness H2 may be 40% to 65% of the first thickness H1. For example, the second thickness H2 may be 50% to 60% of the first thickness H1. When the second thickness H2 is less than 30% of the first thickness H1, a thickness of a region to be removed by a polishing process increases in the process of forming the first via part 150 and the second via part 160, and accordingly, the manufacturing process may be complicated. Also, when the second thickness H2 is greater than 70% of the first thickness H1, even after the second via part 160 is formed, a dimple region may be formed on the second via part 160.

In other words, the first portion 151 of the first via part 150 may be disposed to surround the first portion 161 of the second via part 160 disposed in the second region of the first via hole. In addition, as shown in FIG. 6b, the second portion 152 of the first via part 150 may be disposed to surround the second portion 162 of the second via part 160 protruding above the upper surface of the insulating layer 110.

Meanwhile, the first via part 150 and the second via part 160 may have different surface roughness for each point of the surface.

Figure 7:
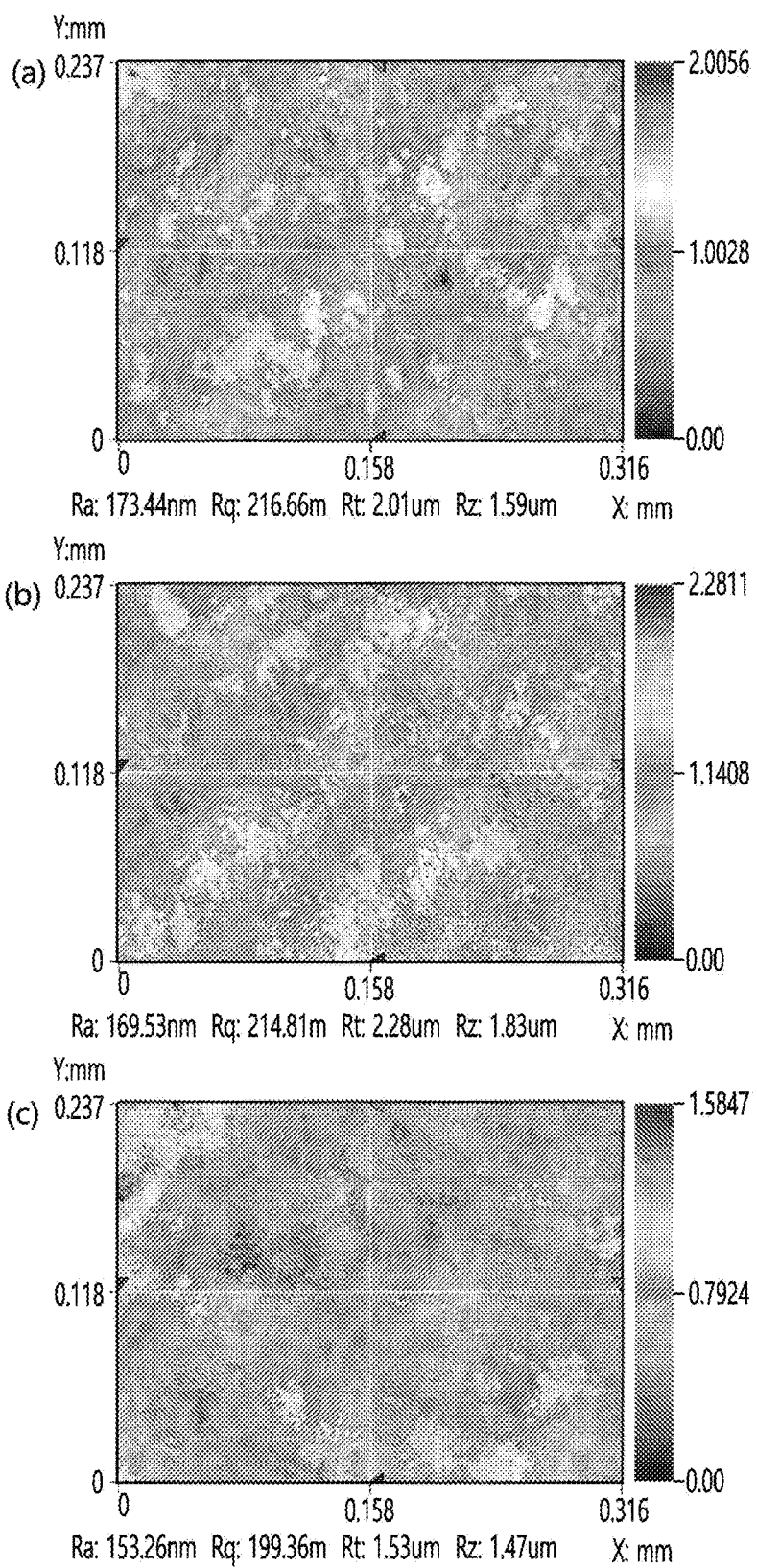
FIGS. 7 and 8 are views showing a surface roughness of a first via according to an embodiment.
Figure 8:
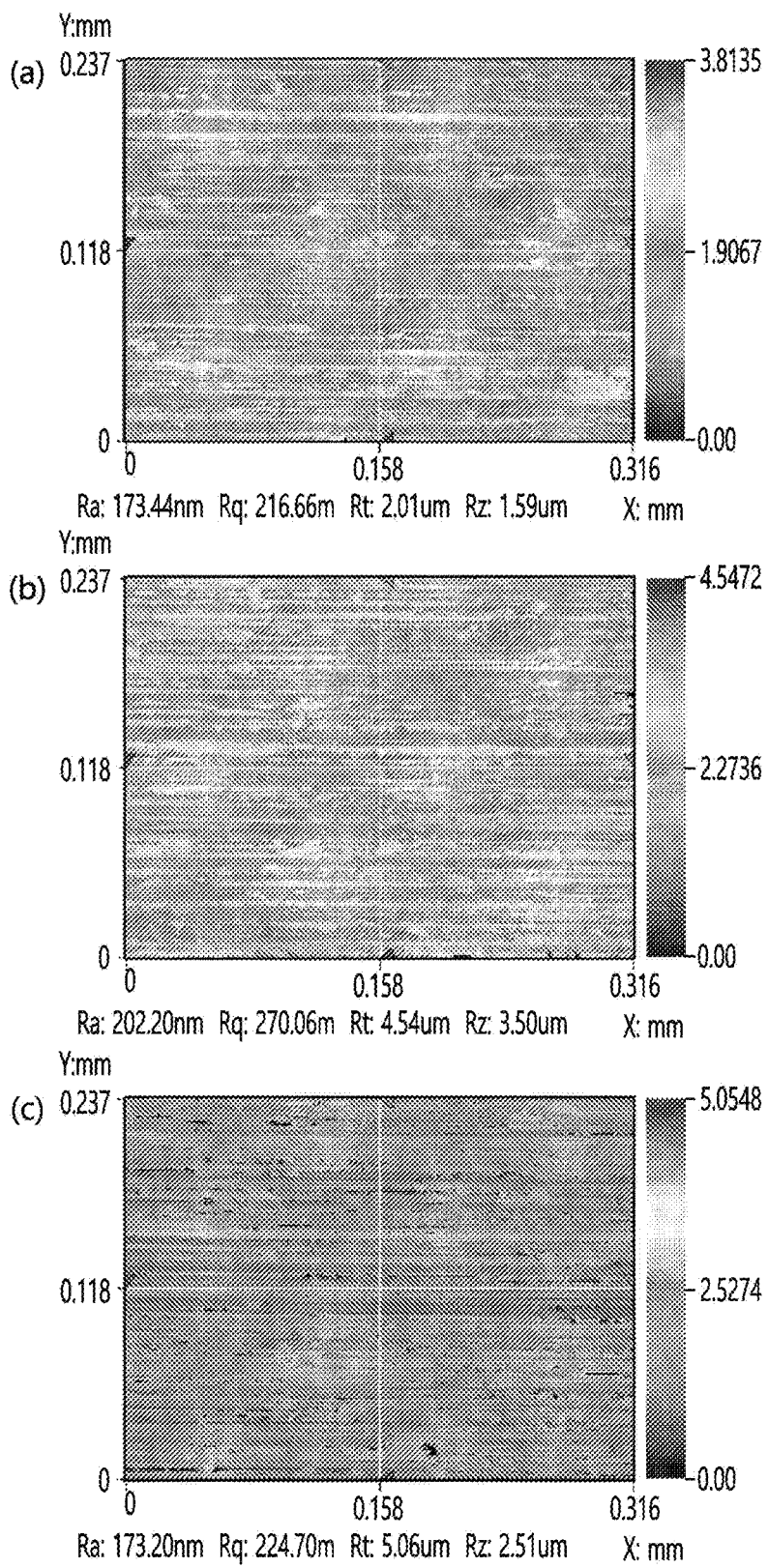

FIGS. 7 and 8 are views showing a surface roughness of the first via according to the embodiment.

The first via part 150 may include an upper surface S1 of the first portion 151 and an upper surface S2 of the second portion 152. In addition, a surface roughness of the upper surface S1 of the first portion 151 of the first via part 150 may be different from a surface roughness of the upper surface S2 of the second portion 152 of the first via part 150.

In this case, as shown in FIG. 7, the surface roughness Ra of the upper surface S1 of the first portion 151 of the first via part 150 may be 150 nm to 180 nm. An average value of the surface roughness Ra of the upper surface S1 of the first portion 151 of the first via part 150 may be 165.41 nm. FIGS. 7(a), (b) and (c) show the surface roughness Ra with respect to different points of the upper surface S1 of the first portion 151 of the first via part 150.

In addition, the surface roughness Ra of the upper surface S2 of the second portion 152 of the first via part 150 may be greater than the surface roughness Ra of the upper surface S1 of the first portion 151 of the first via part 150. That is, as shown in FIG. 8, the surface roughness Ra of the upper surface S2 of the second portion 152 of the first via part 150 may be 170 nm to 205 nm. That is, the average value of the surface roughness Ra of the upper surface S2 of the second portion 152 of the first via part 150 may be 193.53 nm. FIGS. 8(a), (b) and (c) show the surface roughness Ra with respect to different points of the upper surface S2 of the second portion 152 of the first via part 150.

In this case, the upper surface S1 of the first portion 151 of the first via part 150 corresponds to the lower surface of the first portion 161 of the second via part 160, and accordingly, the same reference numeral S1 is assigned. In other words, the upper surface S1 of the first portion 151 of the first via part 150 or the lower surface of the first portion 161 of the second via part 160 is the first via part 150 may mean a boundary surface between the upper surface S1 of the first portion 151 and the lower surface of the first portion 161 of the second via part 160.

The second via part 160 may include a lower surface S1 of the first portion 161 and an upper surface S3 of the second portion 162. In addition, a surface roughness of the lower surface S1 of the first portion 161 of the second via part 160 may be different from a surface roughness of the upper surface S3 of the second portion 162 of the second via part 160.

In this case, as shown in FIG. 7, the surface roughness Ra of the lower surface S1 of the first portion 161 of the second via part 160 may be 150 nm to 180 nm. An average value of the surface roughness Ra of the lower surface S1 of the first portion 161 of the second via part 160 may be 165.41 nm. FIGS. 7(a), (b) and (c) shows the surface roughness Ra with respect to different points of the lower surface S1 of the first portion 161 of the second via part 160.

In addition, the surface roughness Ra of the upper surface S3 of the second portion 162 of the second via part 160 may be greater than the surface roughness Ra of the lower surface S1 of the first portion 161 of the second via part 160. That is, as shown in FIG. 8, the surface roughness Ra of the upper surface S3 of the second portion 162 of the second via part 160 may be 170 nm to 205 nm. That is, the average value of the surface roughness Ra of the upper surface S3 of the second portion 162 of the second via part 160 may be 193.53 nm. FIGS. 8(a), (b) and (c) show the surface roughness Ra with respect to different points of the upper surface S3 of the second portion 162 of the second via part 160.

According to the embodiment, there is a restriction on the plating of a large-diameter via hole in the case of a conventional large-area via, but the embodiment can break the restriction on the large-diameter via-hole plating of a large-area via by changing the plating method, and accordingly, plating of the large-diameter via hole can be stably implemented. In addition, according to this embodiment, it is possible to secure the uniformity of the via plating compared to the conventional method, and quality reliability can be secured by improving laser quality after additional lamination.

In addition, in the prior art, there was a limit ratio in the method for stably realizing the plating inside the via hole between the thickness of the insulating layer and the size of the via hole. According to this embodiment, it is possible to break the design constraints for the implementation of a highly reliable plating state inside the via hole, and accordingly, the degree of design freedom may be improved. In addition, the embodiment can completely shield the interference between circuits occurring in a region where circuits are dense by increasing the size of the via, and it is possible to improve heat dissipation characteristics in a region where the role of heat dissipation is required.

Specifically, a heat dissipation function in the comparative example is performed using a plurality of heat dissipation vias spaced apart from each other by a predetermined interval in the horizontal direction. In the embodiment, a single large-area via is used to perform a heat dissipation function and to ensure the uniformity of its plating, and it is possible to improve the heat dissipation performance compared to the comparative example due to the increase in the area of the via.

Hereinafter, a method of manufacturing the circuit board according to the first embodiment shown in FIG. 5 will be described in detail.

FIGS. 9 to 18 are views showing the manufacturing method of the circuit board according to the first embodiment in order of process.

Figure 9:
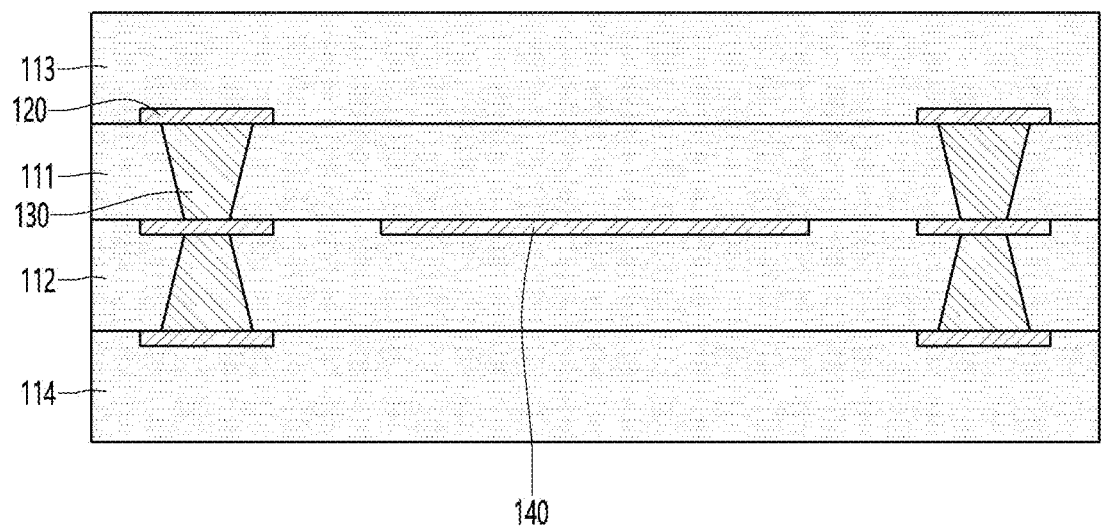
FIGS. 9 to 18 are views showing a manufacturing method of the circuit board according to the first embodiment in order of process.

Referring to FIG. 9, a basic lamination process for manufacturing a circuit board may be firstly performed. Here, the basic lamination process may include an insulating layer lamination process and a circuit pattern forming process before the first via 170 is formed.

To this end, a process of preparing the first insulating layer 111 is first performed, and a process of forming a via hole VH1 for forming the second via 130 in the first insulating layer 111 may be performed.

Thereafter, when the via hole VH1 is formed, a second via 130 filling the inside of the via hole VH1 is formed, and a process of forming the first pad 140 and the second pad 120 on the surface of the first insulating layer 111 may be performed together with the formation of the second via 130.

In addition, a process of forming a second insulating layer 112 on the lower surface of the first insulating layer 111 is performed, a process of forming a fourth insulating layer 114 on the lower surface of the second insulating layer 112 is performed, and a lamination process of forming the third insulating layer 113 on the upper surface of the first insulating layer 111 may be performed. Meanwhile, as described above, the number of layers constituting the insulating layer 110 may be changed according to an embodiment, and the stacking order thereof may also be changed.

The insulating layer 110 in the embodiment may include a first insulating layer 111, a second insulating layer 112, a third insulating layer 113, and a fourth insulating layer 114, but is not limited thereto. For example, the circuit board may have a number of layers less than 4 layers, and alternatively may have a number of layers greater than 4 layers. However, the circuit board may include at least two insulating layers.

And, in an embodiment, a process of forming a circuit pattern on the surface of the insulating layer 110 may be performed. For example, a process of forming a circuit pattern on the surfaces of the first insulating layer 111 and the second insulating layer 112 may be preferentially performed. In this case, the circuit pattern may include a via pad connected to a via, a connection pad connected to an external substrate, a mounting pad on which an electronic component is mounted, and a trace serving as a signal transmission line between the pads.

For example, a process of forming a circuit pattern on the surfaces of the first insulating layer 111 and the second insulating layer 112 may be performed, which may include the first pad 140 and the second pad 120. The first pad 140 and the second pad 120 may be a part of a circuit pattern formed on the surfaces of the first insulating layer 111 and the second insulating layer 112, and it may refer to a portion connected to the via among the entire region of the circuit pattern substantially disposed on the surface of each insulating layer.

The first pad 140 and the second pad 120 may be a pattern that transmits an electrical signal, or differently formed for the purpose of heat dissipation, may be a pattern that transmits heat.

The first pad 140 may be disposed on the lower surface of the first insulating layer 111, but is not limited thereto. In other words, the first pad 140 may be connected to the first via 170 having a large area passing through the plurality of insulating layers in common. However, the first pad 140 is disposed at the interface between the plurality of insulating layers, and accordingly, one end may be connected to the first via 170 disposed on the first pad 140, and the other end may be connected to the other first via 170 disposed under the first pad 140.

The first pad 140 may have a first cross-sectional area. Preferably, the first pad 140 may have a first cross-sectional area greater than an upper cross-sectional area or a lower cross-sectional area of the first via 170.

The second pad 120 may be disposed on the surface of the first insulating layer 111 and the second insulating layer 112, respectively. In other words, the second pad 120 may be connected to the normally-sized second via 130 penetrating each insulating layer. Accordingly, the second pad 120 may be disposed on each surface of the plurality of insulating layers.

Figure 10:
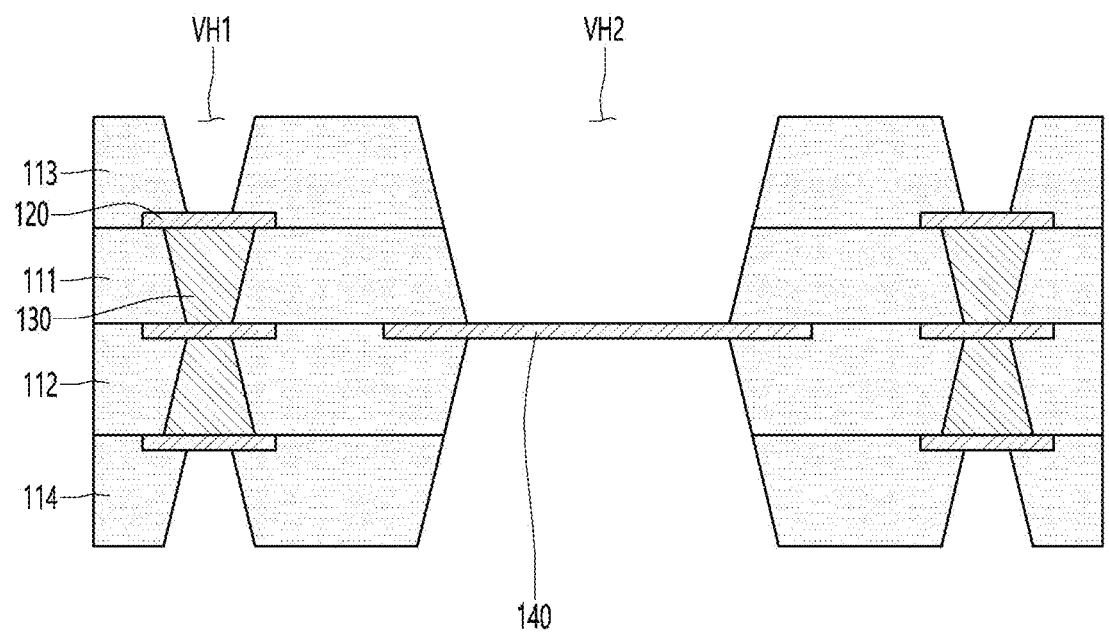

Next, as shown in FIG. 10, a process of penetrating the insulating layer 110 may be performed to form a via hole in the insulating layer 110. In this case, the via hole may include a first via hole and a second via hole. The first via hole may have a first area, and the second via hole may have a second area. In addition, the first area and the second area may be different from each other. For example, the via hole may include a first via hole VH2 for forming the first via 170 and a second via hole VH1 for forming the second via.

The first via hole VH2 may be formed to pass through a plurality of insulating layers in common. In addition, the second via hole VH1 may be formed to penetrate only one of the plurality of insulating layers.

That is, the first via hole VH2 may have a first width W1. Preferably, the first width W1 of the first via hole VH2 may include a width in the first direction and a width in the second direction of the first via hole VH2. In addition, the width of the first via hole VH2 in the first direction may be greater than 500 μm. For example, the width of the first via hole VH2 in the first direction may be greater than 1000 μm. For example, the width of the first via hole VH2 in the first direction may be greater than 2000 μm. For example, the width of the first via hole VH2 in the first direction may be greater than 2500 μm. For example, the width of the first via hole VH2 in the second direction may be greater than 500 μm. For example, the width of the first via hole VH2 in the second direction may be greater than 1000 μm. For example, the width of the first via hole VH2 in the second direction may be greater than 2000 μm. For example, the width of the first via hole VH2 in the first direction may be greater than 2500 μm.

In this case, the width of the first via hole VH2 in the first direction may be the same as the width of the first via hole VH2 in the second direction, but is not limited thereto. That is, the diameter of the first via hole VH2 in the first direction and the diameter in the second direction may be different from each other, and thus may have a bar or oval shape.

Meanwhile, when the width of the first via hole VH2 is smaller than the above range, it may be substantially a size corresponding to the second via hole VH1.

Here, the reason why the first via hole is VH2 and the second via hole is VH1 is because the numbers are given in the order of the sizes of the respective via holes in the order of smallest. Accordingly, the first via hole having a relatively large size was named VH2.

Figure 11:
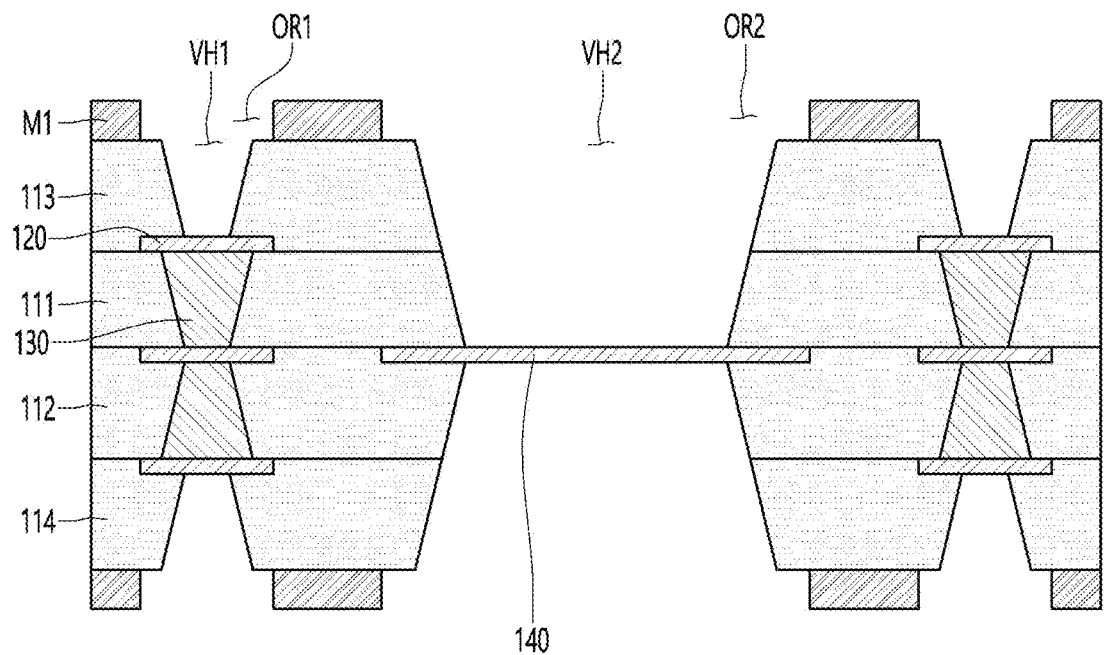

Next, as shown in FIG. 11, a process of forming a first mask M1 on the surface of the insulating layer 110 may be performed.

The first mask M1 may include a plurality of openings.

Specifically, the first mask M1 includes a first opening OR2 exposing the first via hole VH2 formed in the insulating layer 110 and a second opening OR1 exposing the second via hole VH1.

In this case, the first opening OR2 may have a width greater than an upper width of the first via hole VH2. In other words, the first opening OR2 is not formed to have a width equal to or smaller than the upper width of the first via hole VH2, but may have a width greater than the upper width of the first via hole VH2. Accordingly, the first opening OR2 may expose the upper surface of the insulating layer 110 around the upper region of the first via hole VH2 as well as the upper region of the first via hole VH2. That is, the first opening OR2 may expose a region in which a connection portion of the first via 170 is to be formed and a region in which a pad of the first via 170 is to be formed, respectively. Here, the region in which the connection portion will be formed may be the first via hole VH2, and the region in which the pad is to be formed may be an upper region of the first via hole VH2 and an upper surface region of the insulating layer 110 adjacent thereto.

In this case, the second opening OR1 may have a width greater than an upper width of the second via hole VH1. In other words, the second opening OR1 is not formed to have a width equal to or smaller than the upper width of the second via hole VH1, but may have a width greater than the upper width of the second via hole VH1. Accordingly, the second opening OR1 may expose the upper surface of the insulating layer 110 around the upper region of the second via hole VH1 as well as the upper region of the second via hole VH1. That is, the second opening OR1 may expose a region in which a connection portion of the second via 130 is to be formed and a region in which a pad of the second via 130 is to be formed, respectively. Here, the region in which the connection portion will be formed may be the second via hole VH1, and the region in which the pad is to be formed may be an upper region of the second via hole VH1 and an upper surface region of the insulating layer 110 adjacent thereto.

Figure 12:
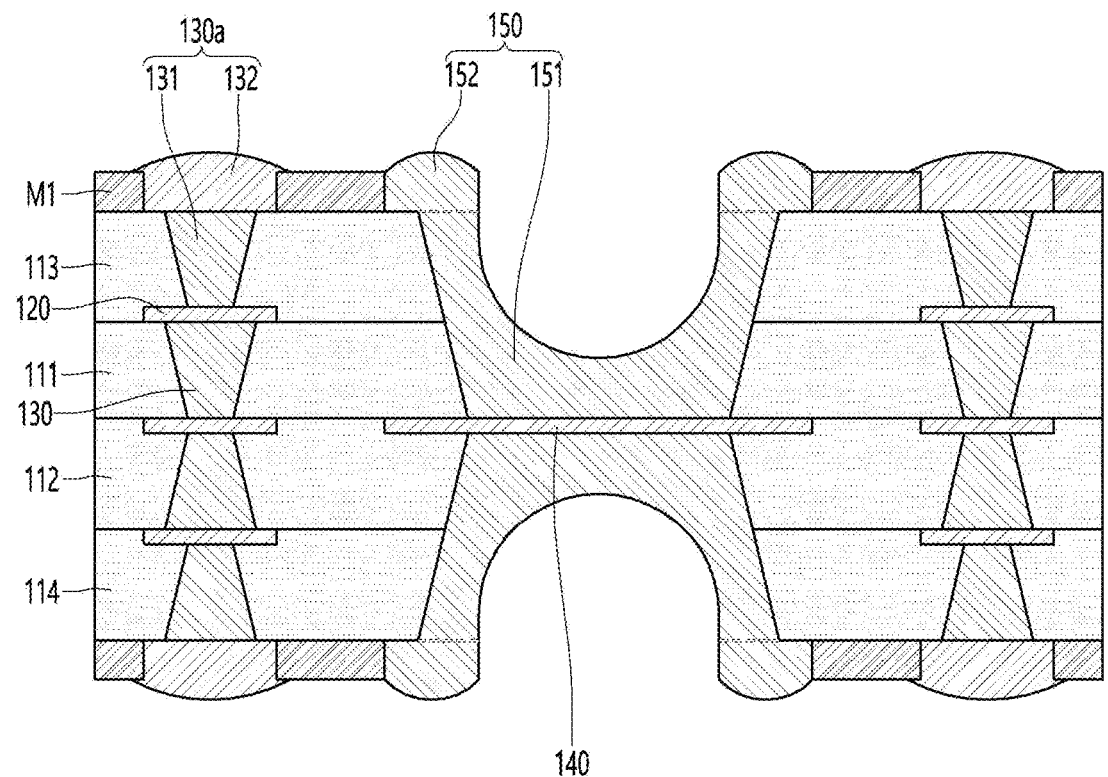

Next, as shown in FIG. 12, when the first via hole VH2 and the second via hole VH1 are formed, the first via 170 and the second via 130 may be formed by filling the first via hole VH2 and the second via hole VH1 with a conductive material.

The metal material forming the first via 170 and the second via 130 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, inkjetting and dispensing.

In this case, the sizes of the first via hole VH2 and the second via hole VH1 are different. Also, the first via hole VH2 is a large-area via. Accordingly, a second via may be formed in the second via hole VH1 in one process to fill it all, but it is difficult to form a first via that fills the first via hole VH2 only by one process.

Accordingly, the first via part 150 of the first via 170 filling a part of the first via hole VH2 is formed by performing a primary plating process, and at the same time, the second via 130a filling all of the second via hole VH1 is formed.

In this case, the second via 130a includes a connection portion 131 disposed in the second via hole VH1 and a pad portion 132 protruding above the connection portion 131.

Also, the upper surface of the pad portion 132 may not be flat. That is, the plating process of the second via hole VH1 is performed together with the plating process of the first via hole VH2. In addition, the plating process of the second via hole VH1 may be performed under conditions for forming the first via part 150 of the first via 170 in the first via hole VH2. Accordingly, the pad portion 132 of the second via 130a formed may have a curved upper surface while protruding above the first mask M1.

In the primary plating process as described above, the first via part 150 of the first via 170 may be formed in the first via hole VH2.

The first via part 150 may include a first portion 151 disposed in the first via hole VH2, and a second portion 152 disposed on the first portion 151 to protrude above the upper surface of the insulating layer 110. In addition, an upper surface of the second portion 152 may have a curved shape like the pad portion 132 of the second via 130a.

The first via part 150 may be formed in a first region of the first via hole. The first region may be an outer region excluding the central region. Preferably, the first region may be a lower region and an outer region of an upper region of the first via hole.

That is, in the first embodiment, a part of the first via hole formed through the plurality of insulating layers in common may be filled by the first via part 150 by the first plating process.

Also, the first portion 151 of the formed first via part 150 may be referred to as a connection portion positioned in the first via hole. For example, the first portion 151 of the first via part 150 may form a portion of the connection portion of the first via 170.

The second portion 152 may be positioned on the opposite side of the first pad 140 with respect to the connection portion of the first via 170, and may be referred to as a via pad connected to the connection portion. For example, the second portion 152 of the first via part 150 may form a part of the pad of the first via 170.

The first portion 151 of the first via part 150 may be formed by filling only a first region corresponding to a partial region, not the entire region of the first via hole.

Accordingly, an upper surface of the first portion 151 of the first via part 150 may have a curved surface instead of a flat surface. Preferably, the upper surface of the first portion 151 of the first via part 150 may have a downwardly concave shape. Accordingly, a length of the upper surface of the first portion 151 of the first via part 150 may be greater than an upper width of the first via hole. That is, the length of the upper surface of the first portion 151 of the first via part 150 may be greater than the upper width corresponding to the linear distance of the upper region of the first via hole.

A part of the upper surface of the first portion 151 of the first via part 150 may be positioned lower than the upper surface of the insulating layer 110. Here, the insulating layer 110 may mean an insulating layer positioned at an uppermost side of the plurality of insulating layers in which the first via hole is formed. For example, a center point of the upper surface of the first portion 151 of the first via part 150 may be lower than the upper surface of the insulating layer 110. In this case, the upper surface of the first portion 151 of the first via part 150 may gradually decrease from an outer portion to a center portion. Accordingly, the center point of the upper surface of the first portion 151 of the first via part 150 may be the lowest, and an outer edge point of the upper surface of the first portion 151 of the first via part 150 may be positioned the highest. Accordingly, a concave portion may be formed in an upper surface of the first portion 151 of the first via part 150. Meanwhile, a length of a lower surface of the first portion 151 of the first via 170 may be the same as a lower width of the first via hole.

The second portion 152 of the first via part 150 may be positioned on the first portion 151. That is, the second portion 152 of the first via part 150 is integrally formed with the first portion 151. That is, the second portion 152 of the first via part 150 may extend from the first portion 151 and protrude above the upper surface of the insulating layer 110.

Figure 13:
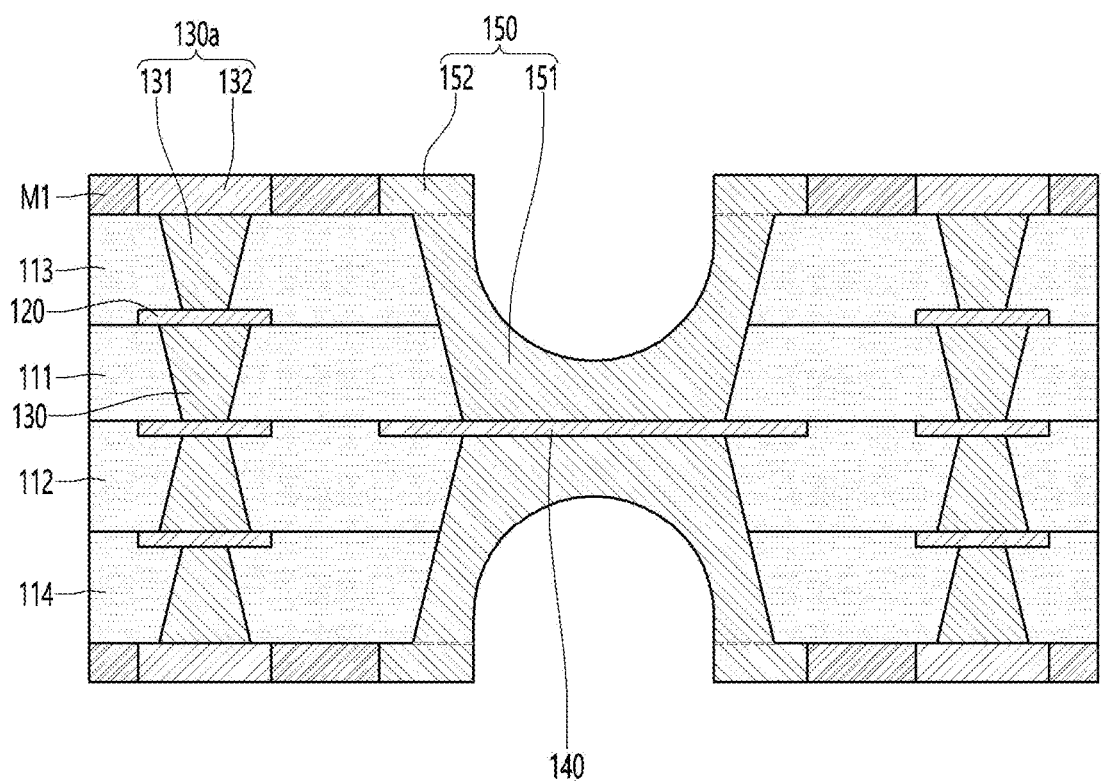

Next, as shown in FIG. 13, a primary grinding process may be performed.

The primary grinding process may be a process of planarizing the upper surface of the second portion 152 of the first via part 150 of the first via 170 formed through the primary plating process. In addition, the primary grinding process may be a process of planarizing the upper surface of the pad portion 132 of the second via 130a that has been performed through the primary plating process.

Figure 14:
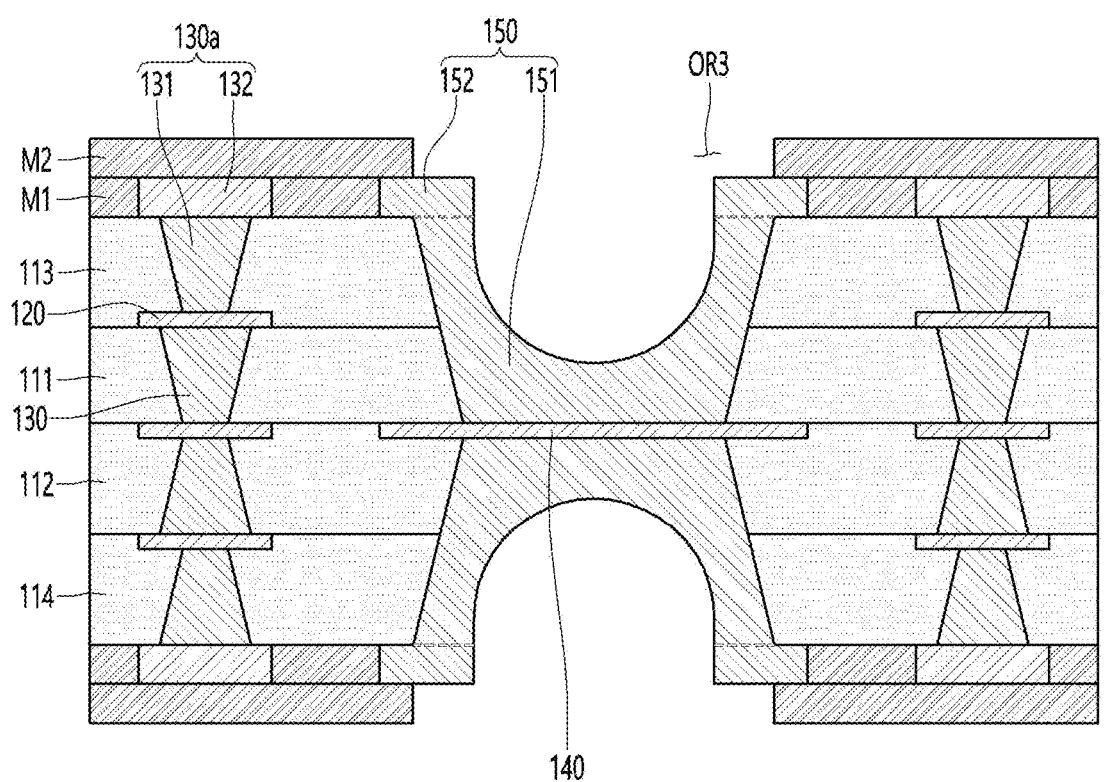

Next, as shown in FIG. 14, a process of forming a second mask M2 on the first mask M1 may be performed.

The second mask M2 may include a third opening OR3. Preferably, the second mask M2 is disposed to cover the upper surface of the first mask M1 and the pad portion 132 of the second via 130a, and a third opening OR3 exposing the first via hole VH2 may be provided.

The third opening OR3 may have a smaller size than the first opening OR2. Accordingly, the second mask M2 may be disposed to cover a part of the upper surface of the second portion 152 of the first via part 150 formed in the primary plating process. In this case, when the size of the third opening OR3 is the same as the size of the first opening OR2 of the first mask M1, plating is performed on the inside of the first via hole VH2 and the second portion 152 of the first via part 150 in a subsequent secondary plating process, and accordingly, it takes a lot of time to fill the entire interior of the first via hole VH2, and a lot of time is required in a subsequent grinding process.

Figure 15:
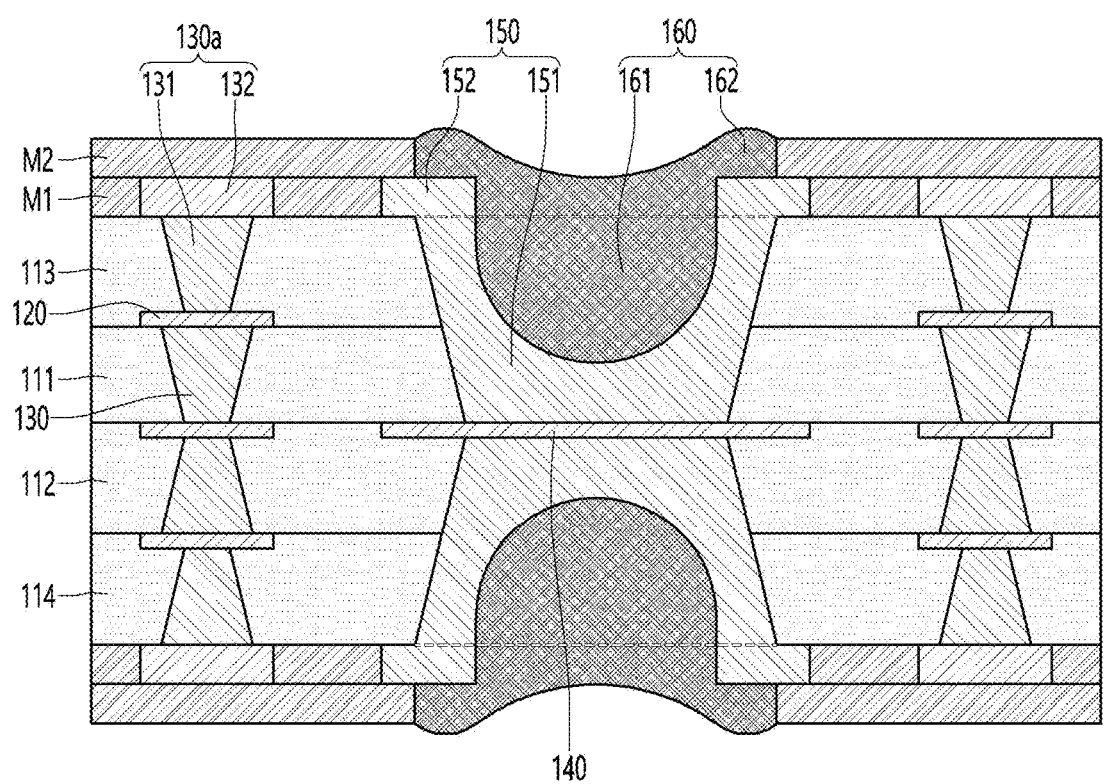

Next, as shown in FIG. 15, a process of forming the second via part 160 of the first via 170 may be performed by performing a secondary plating process in the first via hole VH2 exposed through the third opening OR3 of the second mask M2.

Meanwhile, the second via part 160 includes a first portion 161 disposed in the second region of the first via hole. The first portion 161 may also be referred to as a connection portion positioned in the first via hole. For example, the first portion 161 of the second via part 160 may form a part of the connection portion of the first via 170.

That is, the first portion 161 of the second via part 160 may form a connection portion of the first via 170 together with the first portion 151 of the first via part 150.

The second via part 160 may include a second portion 162 disposed on the first portion 161 and protruding from the upper surface of the insulating layer 110. The second portion 162 may be positioned on the opposite side of the first pad 140 with respect to the connection portion of the first via 170, and may be referred to as a via pad connected to the connection portion. For example, the second portion 162 of the second via part 160 may form a part of the pad of the first via 170. That is, the second portion 162 of the second via part 160 may form a pad (specifically, an upper pad) together with the second portion 152 of the first via part 150.

The first portion 161 of the second via part 160 may be formed by filling only a second region corresponding to a partial region, not the entire region of the first via hole. Specifically, the first portion 161 of the second via part 160 may be formed to fill a recess formed in the upper surface of the first region 151 of the first via part 150.

Accordingly, a lower surface of the first portion 161 of the second via part 160 may have a curved surface instead of a flat surface. Preferably, a lower surface of the first portion 161 of the second via part 160 may have a downwardly convex shape. Accordingly, a length of the lower surface of the first portion 161 of the second via part 160 may be greater than the upper width and the lower width of the first via hole, respectively. That is, the length of the lower surface of the first portion 161 of the second via part 160 may be greater than the upper width corresponding to the linear distance of the upper region of the first via hole.

A part of the lower surface of the first portion 161 of the second via part 160 may be positioned lower than the upper surface of the insulating layer 110. Here, the insulating layer 110 may mean an insulating layer positioned at an uppermost side among the plurality of insulating layers in which the first via hole is formed. For example, a center point of the lower surface of the first portion 161 of the second via part 160 may be lower than the upper surface of the insulating layer 110. In this case, the lower surface of the first portion 161 of the second via part 160 may gradually decrease from an outer portion to a center portion. Accordingly, the center point of the lower surface of the first portion 161 of the second via part 160 may be positioned at the lowest position, and the outer edge point may be positioned at the highest position. Accordingly, a convex portion may be formed on a lower surface of the first portion 161 of the second via part 160.

The second portion 162 of the second via part 160 formed through a secondary plating process may be positioned on the first portion 161. That is, the second portion 162 of the second via part 160 is integrally formed with the first portion 161. That is, the second portion 162 of the second via part 160 may extend from the first portion 161 to protrude above the upper surface of the insulating layer 110.

In this case, the upper surface of the second portion 162 of the second via part 160 may have a curvature, and a dimple phenomenon may occur in a specific region.

Figure 16:
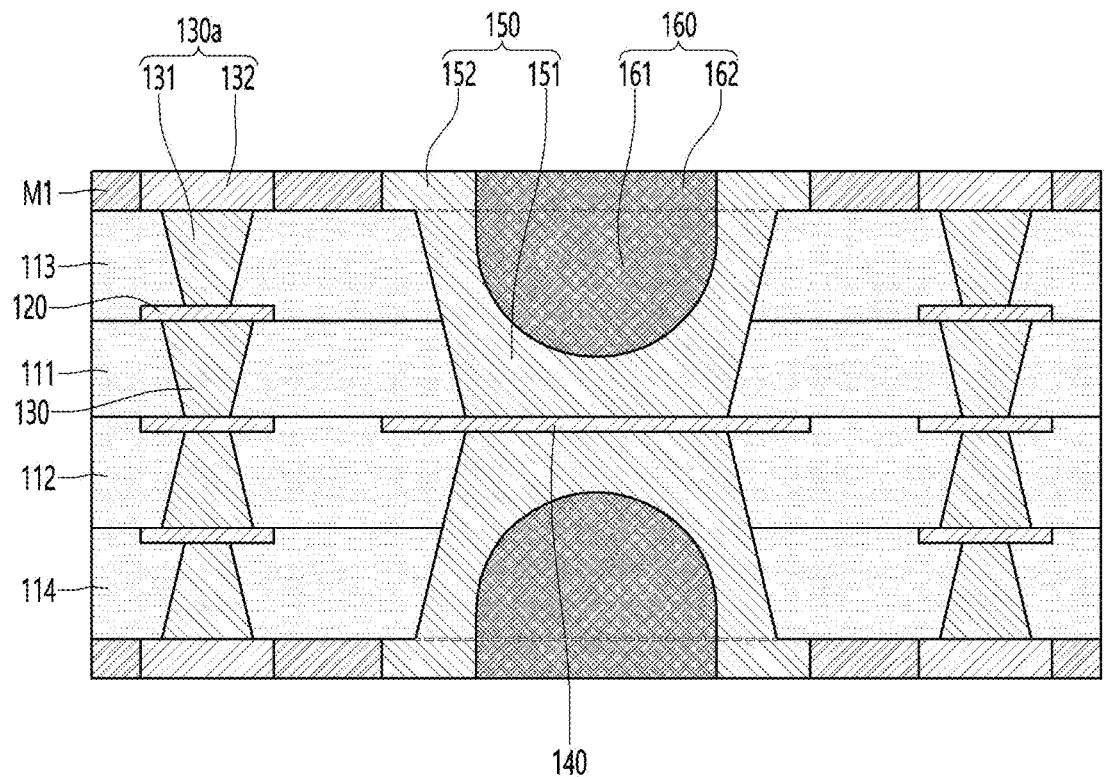

Next, as shown in FIG. 16, a secondary grinding process of removing the second mask M2 and planarizing the upper surface of the second portion 162 of the second via part 160 is performed.

By the secondary grinding process, the upper surface of the second portion 162 of the second via part 160 may be planarized, and the upper surface of the second portion 162 of the second via part 160 may be on same plane as the upper surface of the pad portion 132 of the second via 130a.

Figure 17:
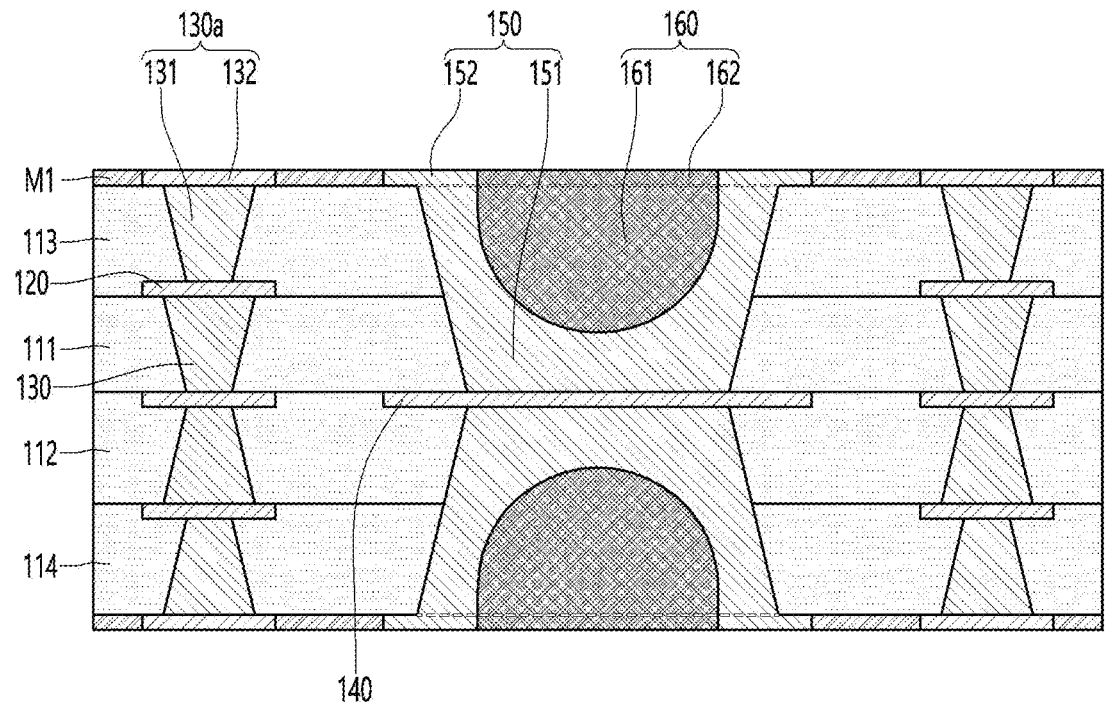

Next, as shown in FIG. 17, a thirdly grounding process of polishing the upper surface of the second portion 152 of the first via part 150, the upper surface of the second portion 162 of the second via part 160, and upper surface of the pad portion 132 of the second via 130a may be performed.

That is, the second portion 152 of the first via part 150, the second portion 162 of the second via part 160, and the pad portion 132 of the second via 130a formed in the previous process has a thickness greater than an actual design thickness. This is to improve plating deviation that may occur in the secondary plating process, and furthermore, the dimple region that may occur in the secondary plating process is to position an ineffective portion, not an effective portion, of the first via. The ineffective portion of the first via may mean a portion removed in the secondary and thirdly grinding processes.

Then, a thickness of each of the second portion 152 of the first via part 150, the second portion 162 of the second via part 160, and the second via 130a may be adjusted to the same level as the thickness of the first pad 140 or the thickness of the second pad 120 by performing the thirdly grinding process.

Figure 18:
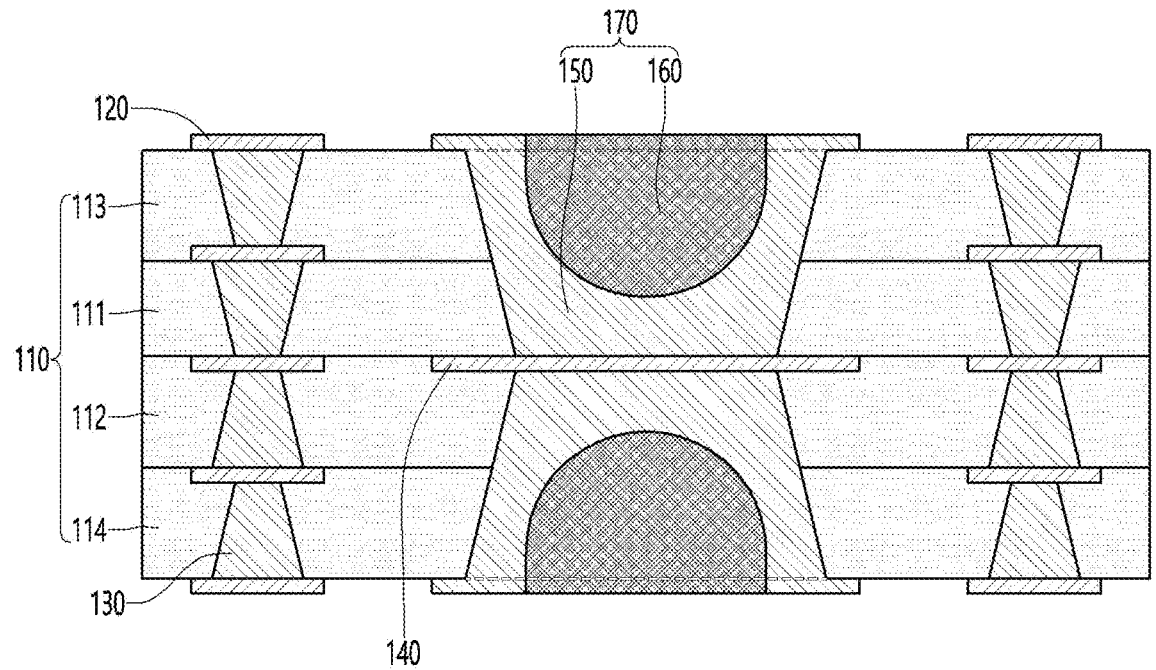

Next, as shown in FIG. 18, a process of removing the first mask M1 may be performed to form a circuit board including first vias and second vias having different structural shapes.

Figure 19:
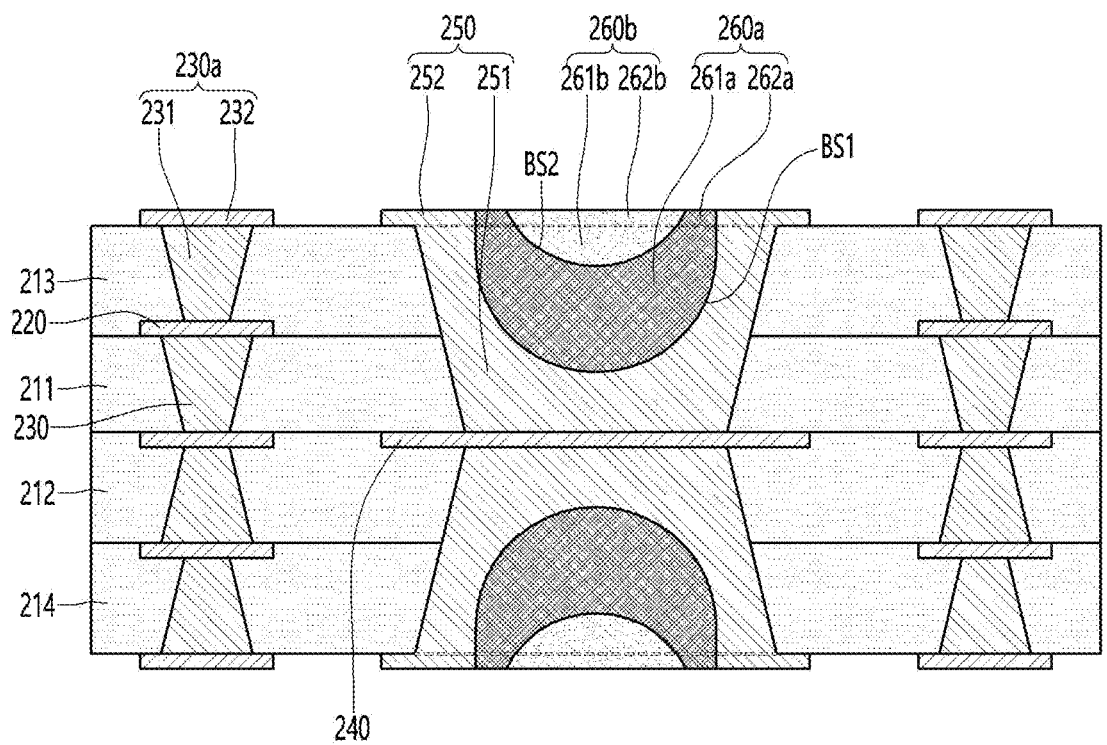
FIG. 19 is a view showing a circuit board according to a second embodiment.
Figure 20A:
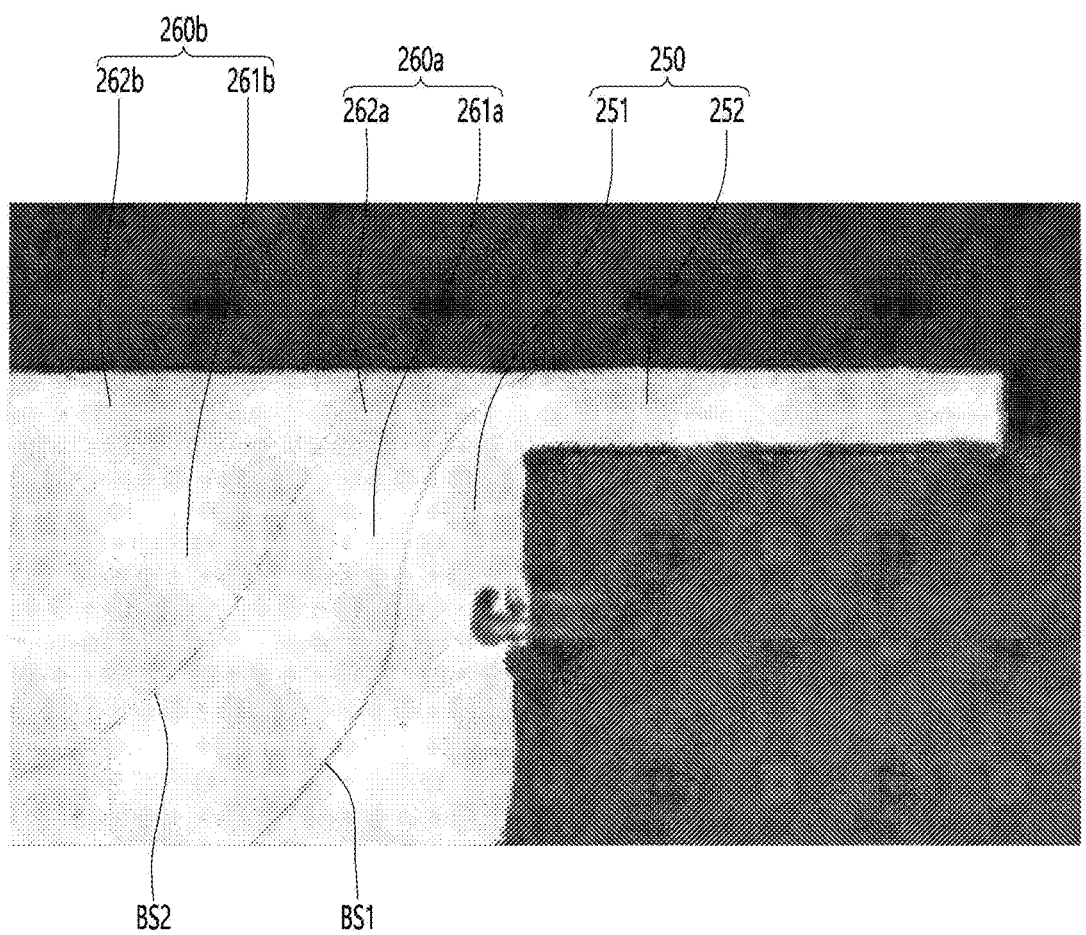
FIG. 20a is a view for explaining an interface of each part of the first via shown in FIG. 19.
Figure 20B:
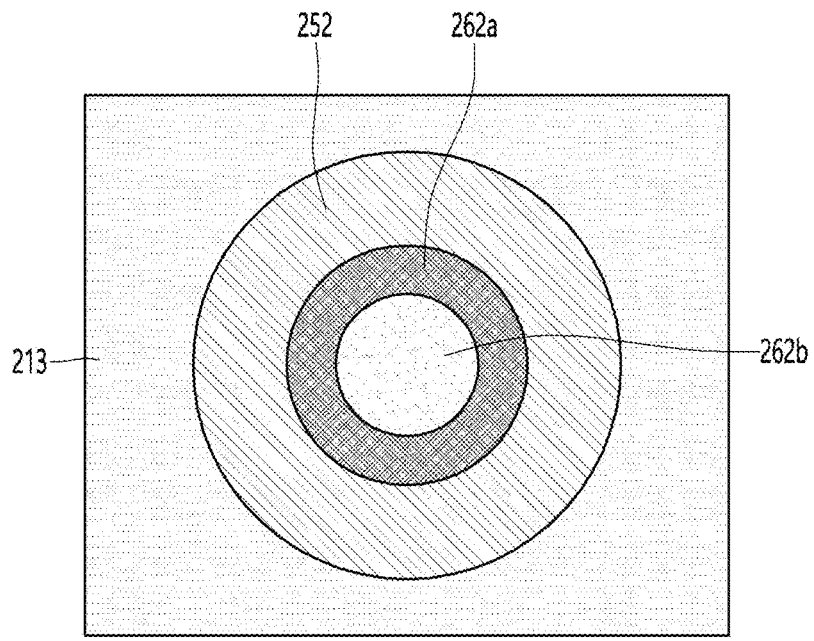
FIG. 20b is a plan view of the first via shown in FIG. 19.

FIG. 19 is a view showing a circuit board according to a second embodiment, FIG. 20a is a view for explaining an interface of each part of the first via shown in FIG. 19, and FIG. 20b is a plan view of the first via shown in FIG. 19.

Referring to FIGS. 19, 20a, and 20b, the circuit board according to the second embodiment has substantially the same structure as the circuit board according to the first embodiment shown in FIG. 5 except for the second via part of the first via. Therefore, in the circuit board according to the second embodiment, the structural characteristics of the second via part of the first via will be mainly described below.

The circuit board according to the second embodiment may include an insulating layer 210, a first pads 240 and a second pads 220 disposed on the surface of the insulating layer 210, and a first via 270 and a second via 230 passing through the insulating layer 210.

Here, the insulating layer, the first pad, the second pad, and the first via has the same structure as the insulating layer, the first pad, the second pad, and the first via in the circuit board according to the first embodiment described with reference to FIG. 5, and thus a description thereof will be omitted.

The first via 270 may include a first via part 250 that fills a part of a first via hole that commonly passes through the plurality of insulating layers and a second via part 260 that fills the remaining part of the first via hole.

The first via part 250 may be formed in a first region of the first via hole. In addition, the second via part 260 may be formed in a second region of the first via hole except for the first region. The second region may be a central region of an upper region excluding a lower region of the first via hole. In addition, the first region may be a region other than the second region. Preferably, the first region may be a lower region and an outer region of an upper region of the first via hole.

That is, in the second embodiment, a portion of the first via hole formed through the plurality of insulating layers in common may be filled by the first via part 250, and the remaining part thereof may be filled by the second via part 260.

Each of the first via part 250 and the second via part 260 includes a portion disposed in the first via hole, and a portion disposed on the portion disposed in the first via hole and protruding above the surface of the insulating layer 210.

That is, the first via part 250 includes a first portion 251 disposed in the first area of the first via hole. The first portion 251 may also be referred to as a connection portion positioned in the first via hole. For example, the first portion 251 of the first via part 250 may form a portion of the connection portion of the first via 270.

The first via part 250 may be disposed on the first portion 251 and include a second portion 252 protruding from the upper surface of the insulating layer 210. The second portion 252 may be positioned on the opposite side of the first pad 240 with respect to the connection portion of the first via 270, and may be referred to as a via pad connected to the connection portion. For example, the second portion 252 of the first via part 250 may form a part of the pad of the first via 270.

The first portion 251 of the first via part 250 may be formed by filling only a first region corresponding to a partial region, not the entire region of the first via hole.

Here, the first via part 250 has substantially the same structure as the first via part 150 described in the first embodiment, and thus a detailed description thereof will be omitted.

The second via part 160 of the first via 270 is disposed in a second region of the first via hole.

In this case, in the first embodiment, the second region of the first via hole was formed by performing a single plating process. Accordingly, the second via part 160 in the first embodiment is composed of a single part.

Unlike this, in the second embodiment, when the second via part 260 is formed, it is formed by performing at least two plating processes instead of one plating process.

Accordingly, the second via part 260 includes a first sub-second via part 260a having an outer surface in contact with the first via part 250 and filling a part of the second region of the first via hole. Also, the second via part 260 includes a second sub-second via part 260b whose outer surface is in contact with the inner surface of the first sub-second via part 260a.

That is, in the second embodiment, the first region of the first via hole is filled by plating a plurality of times, and accordingly, the second via part 260 may include a first sub-second via part 260a and a second sub-second via part 260b having interfaces separated from each other.

Accordingly, the first sub-second via part 260a may include a first portion 261a disposed in the first via hole and a second portion 262a disposed on the first portion 261a and protruding above the upper surface of the insulating layer.

In addition, the second sub-second via part 260b also may include a first portion 261b disposed in the first via hole and a second portion 262b disposed on the first portion 261b and protruding above the upper surface of the insulating layer.

Accordingly, in the first embodiment, the interface of the via part constituting the first via includes only one interface between the first via part and the second via part.

Unlike this, in the second embodiment, the interface of the via part constituting the first via may include a first interface BS1 between the first via part and the first sub-second via part 260a, a second interface BS2 between first sub-second via part 260a and the second sub-second via part 260b.

Here, the reason why the plating process is performed by dividing the second via part 260 of the first via a plurality of times is to minimize plating deviation caused by the plating process. Furthermore, in order to form the second via part 260 in one process, the current condition in the plating condition may be greater than the current limit of the general plating equipment, and accordingly, the second via part 260 is formed by dividing the plurality of times under a current condition lower than the limit current.

Accordingly, the outer surface of the first sub-second via part 260a has a characteristic corresponding to the outer surface of the second via part 160 in the first embodiment.

A part of the inner surface of the first sub-second via part 260a may be positioned lower than the upper surface of the insulating layer 210. Here, the insulating layer 210 may mean an insulating layer positioned at an uppermost side of the plurality of insulating layers in which the first via hole is formed. For example, a center point of the inner surface of the first sub-second via part 260a may be lower than the upper surface of the insulating layer 210. In this case, the inner surface of the first portion 261a of the first sub-second via part 260a may gradually decrease from an outer portion to a center portion. Accordingly, the center point of the inner surface of the first portion 261a of the first sub-second via part 260a may be the lowest, and an outer edge point of the inner surface of the first portion 261a of the first sub-second via part 260a may be positioned the highest. Accordingly, a concave portion may be formed in an upper surface of the first portion 151 of the first via part 150. Accordingly, an outer surface of the first sub-second via part 260a may form a convex portion, and an inner surface thereof may form a concave portion.

Accordingly, as shown in FIG. 20b, the second portion 261b of the first sub-second via part 260a may be disposed to surround the second portion 262b of the second sub-second via part 260b. In addition, the second portion 252 of the first via part 250 may be disposed to surround the periphery of the second portion 261b of the first sub-second via part 260a.

FIGS. 21 to 24 are views for explaining a manufacturing method of the circuit board according to the second embodiment in order of process.

Figure 21:
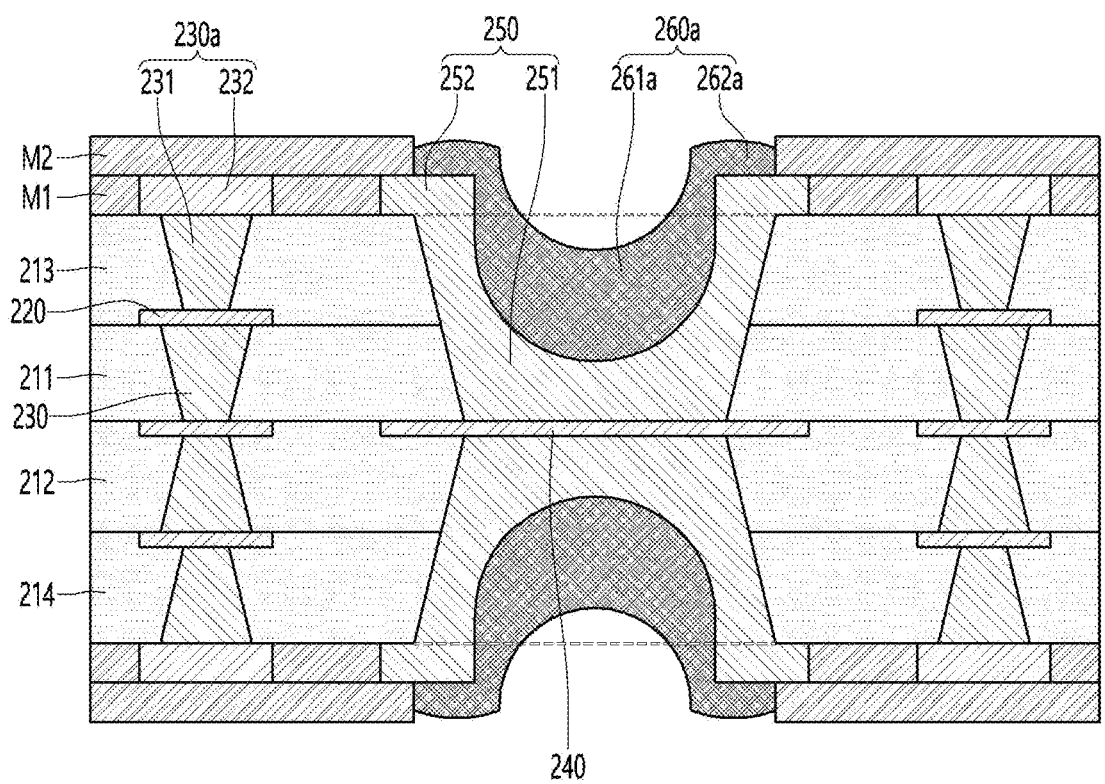
FIGS. 21 to 24 are views for explaining a manufacturing method of the circuit board according to the second embodiment in order of process.

Referring to FIG. 21, the process shown in FIGS. 9 to 14 may be performed preferentially.

Thereafter, in the first embodiment, a secondary plating process was performed to completely fill the remaining portions of the first via hole at once. In contrast, the first sub-second via part 260a in the second embodiment may be formed by first performing a first sub-secondary plating process for filling only a portion of the remaining portion of the first via hole.

Figure 22:
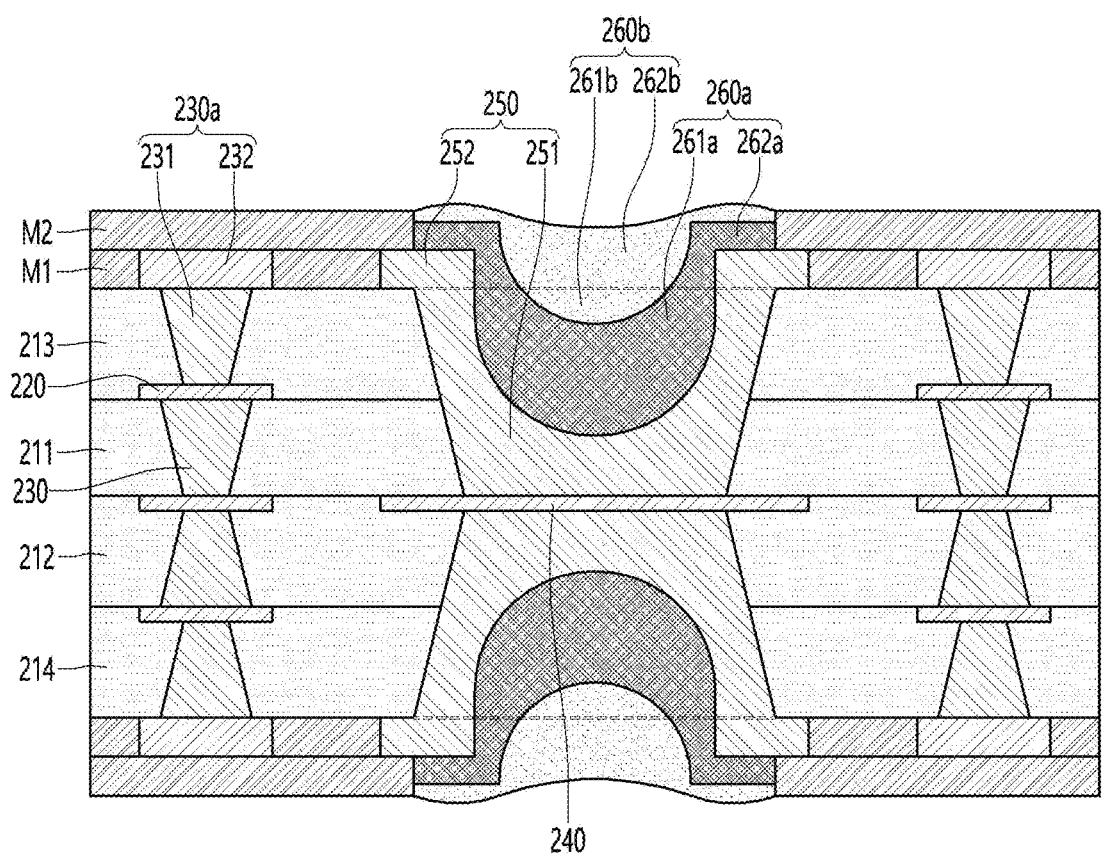
Figure 23:
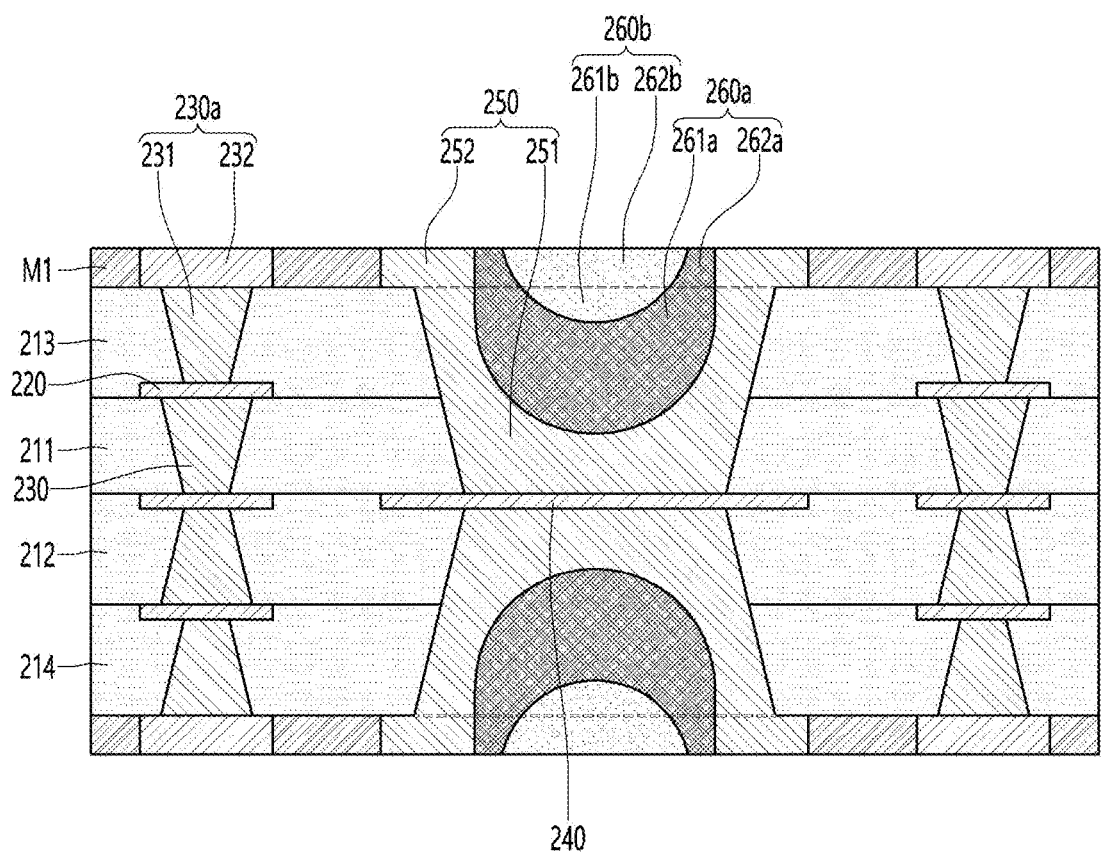

Next, referring to FIG. 22, a second sub-second via part 260b may be formed by performing a second sub-secondary plating process for filling all remaining portions of the first via hole on the first sub-second via part 260a.

Next, a process of removing the second mask M2 is performed, and a process of planarizing an upper surface of each of the second portions of the first sub-second via part 260a and the second sub-second via part 260b may be performed.

Figure 24:
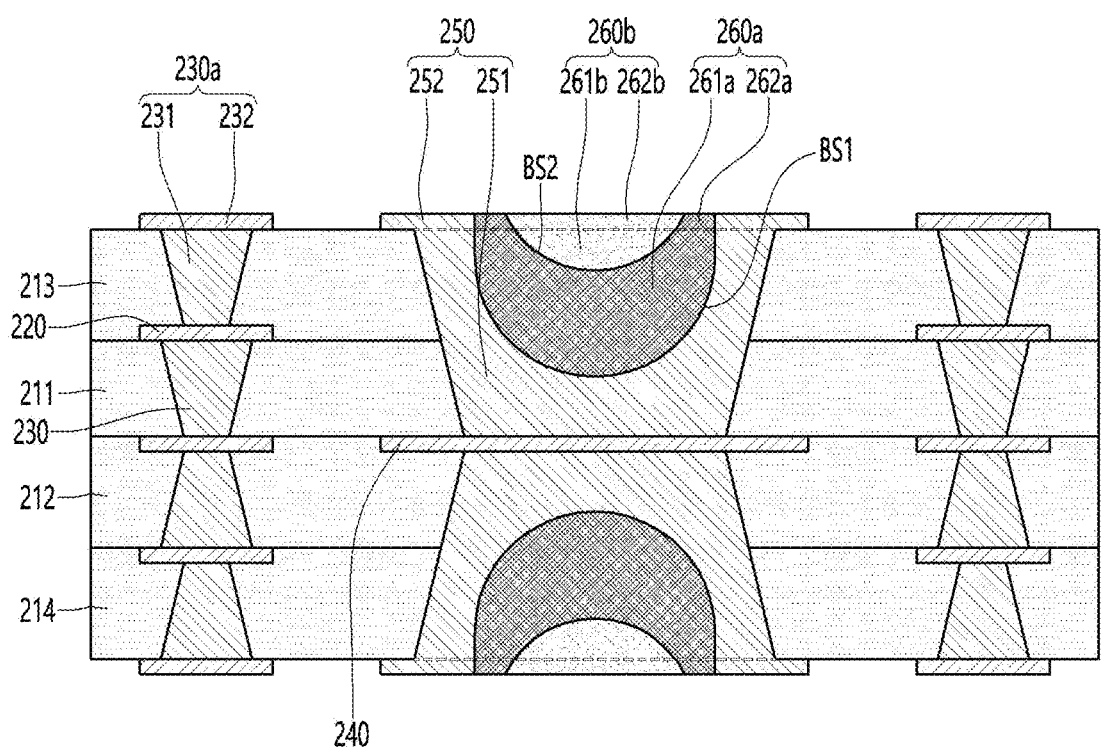

Then, thereafter, as shown in FIG. 24, the first via and the second via having a pad thickness corresponding to an actual design value may be formed by grinding a pad portion of the first via and the second via (the second portion of the first via part, the second portion of the first sub-second via part, and the second portion of the second sub-second via part).

What is claimed is:
1. A circuit board comprising:
a first insulating layer;
a second insulating layer disposed on the first insulating layer;
a first through electrode disposed in a first through hole integrally passing through the first insulating layer and the second insulating layer along a vertical direction;
a second through electrode disposed in a second through hole passing through at least a portion of the first insulating layer along the vertical direction; and
a third through electrode disposed in a third through hole passing through at least a portion of the second insulating layer along the vertical direction;
wherein the first through electrode includes:
a first electrode disposed on an inner wall of the first through hole; and
a second electrode part disposed on the first electrode part; and
wherein
a width of the first through electrode in a horizontal direction is greater than a width of the second through electrode or the third through electrode in the horizontal direction.

2. The circuit board of claim 1, wherein the first through electrode includes a through portion disposed in the first through hole and a pad portion disposed on the through part and protruding toward the second insulating layer, and
wherein the pad portion is divided into a first pad portion provided as the first electrode part and a second pad portion provided as the second electrode part along the horizontal direction.

3. The circuit board of claim 2, wherein the first electrode part includes:
a first portion disposed in the first through hole and corresponding to the through portion; and
a second portion disposed on the first portion and corresponding to the first pad portion;
wherein the second electrode part includes:
a third portion disposed on the first portion of the first electrode part in the first through hole and corresponding to the through portion;
a fourth portion disposed on the third portion and corresponding to the second pad portion.

4. The circuit board of claim 1, wherein the first electrode part is includes a concave surface in contact with the second electrode part, and
wherein a lower surface of the second electrode part includes a convex surface in contact with the concave surface of the first electrode part.

5. The circuit board of claim 4, wherein a first surface roughness of the concave surface or the convex surface is smaller than a second surface roughness of an upper surface of a pad portion.

6. The circuit board of claim 4, wherein a vertical distance from an uppermost end of the first electrode part to a lowermost end of the concave surface of the first electrode part ranges from 30% to 70% of a total thickness of the first through electrode.

7. The circuit board of claim 4, wherein a vertical distance from an uppermost end of the second electrode part to a lowermost end of the convex surface of the second electrode part ranges from 30% to 70% of a total thickness of the first through electrode.

8. The circuit board of claim 1, wherein an uppermost end of the first electrode part and an uppermost end of the second electrode part are positioned on a same plane.

9. The circuit board of claim 1, comprising:
a first pad disposed on a lower surface of the first insulating layer and vertically overlapped with the first through hole; and
wherein the first electrode part is disposed on the first pad.

10. The circuit board of claim 1, wherein the first through electrode has an inclination such that a width of the first through electrode in the horizontal direction gradually decreases from an upper surface of the first through electrode toward a lower surface of the first through electrode, and
wherein each of the second through electrode and the third through electrode overlaps the inclination in the horizontal direction.

11. The circuit board of claim 1, wherein a lowermost end of the second electrode part is positioned lower than an interface between the first and second insulating layers.

12. The circuit board of claim 10, wherein the second through electrode has an inclination such that a width of the second through electrode in the horizontal direction gradually decreases from an upper surface of the second through electrode toward a lower surface of the second through electrode, and
wherein the third through electrode has an inclination such that a width of the third through electrode in the horizontal direction gradually decreases from an upper surface of the third through electrode toward a lower surface of the third through electrode.

13. The circuit board of claim 3, wherein first through electrode includes a third electrode part disposed on the second electrode part.

14. The circuit board of claim 13, wherein the third electrode part includes:
a fifth portion disposed in the first through hole and corresponding to the through portion; and
a sixth portion disposed on the fifth portion and protruding toward the second insulating layer.

15. The circuit board of claim 14, wherein the second electrode part includes a concave surface in contact with the third electrode part, and
wherein the third electrode part includes a convex surface in contact with the concave surface of the second electrode part.

16. The circuit board of claim 2, wherein the pad portion further includes a third pad portion provided as the third electrode part together with the first pad part and the second pad part along the horizontal direction.

17. The circuit board of claim 15, wherein a third surface roughness of the convex surface of the third electrode part is smaller than a surface roughness of an upper surface of the third electrode part.

18. The circuit board of claim 16, wherein the first pad portion, the second pad portion, and the third pad portion are positioned on a same plane with one another.

* * * * *